(12) United States Patent
Livornesi et al.

(10) Patent No.: US 12,379,198 B2
(45) Date of Patent: *Aug. 5, 2025

(54) CIRCUIT FOR BIASING AN EXTERNAL RESISTIVE SENSOR

(71) Applicant: STMicroelectronics S.r.l., Agrate Brianza (IT)

(72) Inventors: Dario Livornesi, Milan (IT); Mattia Fausto Moretti, Monza (IT); Paolo Pulici, Lainate (IT); Alessio Emanuele Vergani, Milan (IT); Alessio Facen, Macerata (IT); Michele Bartolini, Carpiano (IT); Roberto Faravelli, Pavia (IT); Francesco Piscitelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 209 days.

This patent is subject to a terminal disclaimer.

(21) Appl. No.: 18/191,689

(22) Filed: Mar. 28, 2023

(65) Prior Publication Data

US 2023/0314117 A1    Oct. 5, 2023

Related U.S. Application Data

(60) Provisional application No. 63/325,025, filed on Mar. 29, 2022.

(51) Int. Cl.
*G01B 7/14*    (2006.01)
*G11B 27/36*    (2006.01)
*H03F 3/16*    (2006.01)

(52) U.S. Cl.
CPC ................ *G01B 7/14* (2013.01); *G11B 27/36* (2013.01); *H03F 3/16* (2013.01)

(58) Field of Classification Search
CPC .... G01B 7/00; G01B 7/14; G11B 5/00; G11B 5/48; G11B 5/58; G11B 5/60; G11B 5/6005; G11B 5/6011; G11B 5/607; G11B 27/00; G11B 27/36; H03F 3/00; H03F 3/04; H03F 3/16; H03F 3/20; H03F 3/21; H03F 3/211; H03F 3/45; H03F 3/45071;
(Continued)

(56) References Cited

U.S. PATENT DOCUMENTS 8,792,198 B1    7/2014 Straub
8,873,191 B2 *    10/2014 Li .................... G11B 5/6076
360/75

(Continued)

OTHER PUBLICATIONS

Abdevand, M.M. et al., "Interface Circuit for Low-Resistance Sensors Based on Noise Cancelling Technique," 2022 17th Conference on Ph. D Research in Microelectronics and Electronics (PRIME). IEEE, 2022, 4 pages.

*Primary Examiner* — Hoai-An D. Nguyen
(74) *Attorney, Agent, or Firm* — Slater Matsil, LLP

(57) ABSTRACT

According to an embodiment, a circuit includes a core and low-frequency recovery circuits. The core circuit is configured to bias a resistive sensor used to measure a fly height of a hard disk drive. The core circuit is additionally configured to amplify a high-frequency component of a sensing signal of the resistive sensor, the sensing signal indicating the fly height. The low-frequency recovery circuit is configured to amplify the sensing signal's low-frequency component.

20 Claims, 21 Drawing Sheets

(58) Field of Classification Search
CPC ............ H03F 3/45076; H03F 3/45179; H03F 3/45197; H03F 3/45479; H03F 3/45632; H03F 3/45744; H03F 3/45766; H03F 2200/00; H03F 2200/429; H03F 2203/00; H03F 2203/45; H03F 2203/45566
USPC ...................................................... 324/71.1
See application file for complete search history.

(56) References Cited

U.S. PATENT DOCUMENTS

| | | |
|---|---|---|
| 10,965,254 B2 | 3/2021 | Moretti et al. |
| 12,073,860 B2 * | 8/2024 | Livornesi ............ H03F 3/45475 |
| 2003/0218813 A1 * | 11/2003 | Dakroub ................ G11B 27/36 |
| 2007/0070536 A1 | 3/2007 | Christianson |
| 2007/0236825 A1 | 10/2007 | Xia |
| 2012/0250484 A1 | 10/2012 | Polley |
| 2014/0185158 A1 | 7/2014 | Li |
| 2019/0372529 A1 | 12/2019 | Moretti et al. |
| 2023/0314117 A1 | 10/2023 | Livornesi |
| 2023/0386514 A1 | 11/2023 | Livornesi |

* cited by examiner

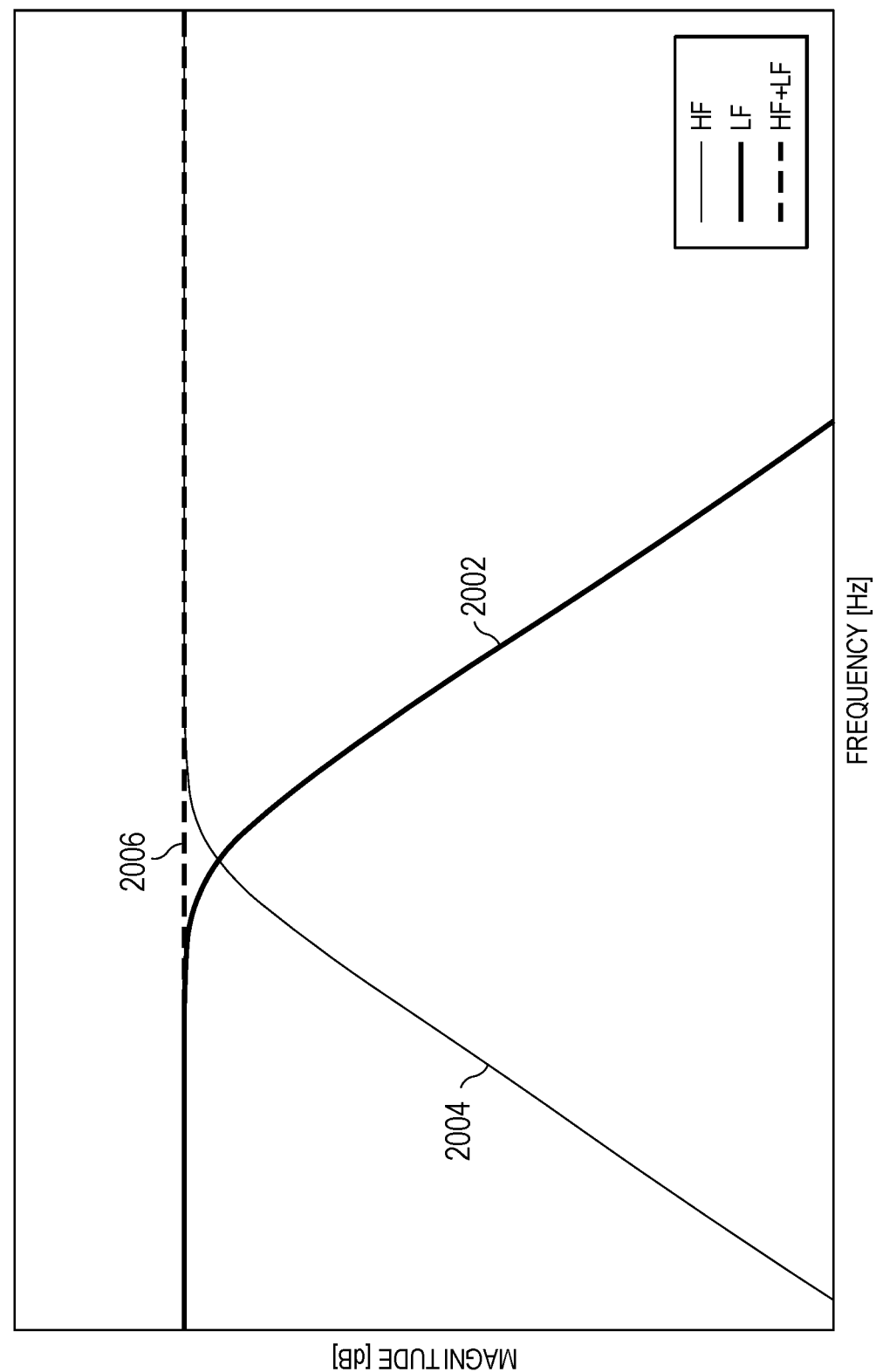

CIRCUIT FOR BIASING AN EXTERNAL RESISTIVE SENSOR

CROSS-REFERENCE TO RELATED APPLICATIONS

This application claims the benefit of U.S. Provisional Application No. 63/325,025, filed on Mar. 29, 2022, which application is hereby incorporated by reference herein in its entirety.

TECHNICAL FIELD

The present disclosure generally relates to an electronic system and method, and, in particular embodiments, to a circuit for biasing a sensor.

BACKGROUND

The distance between a disk drive head of a hard disk drive (HDD) and the platter (i.e., disk) is generally known as the fly height or the head gap. An accurate measurement of the fly height is critical for the performance of the hard disk drive. When the fly height is too large, the read and write errors become excessive, and when the fly height becomes too small, a head crash (i.e., hard disk failure) can occur from, for example, the hard disk drive contacting the disk or rotating platter. As the hard disk drive density increases, the trace width becomes narrower, and the need for an accurate fly height becomes more acute.

Typically, a heating element elevates the temperature of a portion of the disk drive head and distorts the shape. The thermal distortion reduces the fly height of the active read or write elements from 10 to 20 nanometers of normal separation to about 1 nanometer. Thermal sensors are used to measure the fly height by sensing small changes in thermal conductivity as the hard disk drive head nears the disk.

For example, in a hard disk drive with a heat-assisted magnetic recording (HAMR), the disk material is temporarily heated to write narrower traces without corrupting nearby stored data. In laser heat-assisted writing, a laser is used to locally heat the media during the write operation—the heated area depends on the laser's wavelength. Typically, a laser coupled sensor (e.g., laser mode hopping detector) is used to monitor the wavelength of the laser and control the trace width. It is, thus, desirable to accurately bias sensors used in hard disk drives to improve the accuracy of the read and write activity with regards to the hard disk drive.

SUMMARY

Technical advantages are generally achieved by embodiments of this disclosure which describe the biasing of a sensor.

A first aspect relates to a circuit, which includes a core and a low-frequency recovery circuit. The core circuit is configured to bias a resistive sensor used to measure a fly height of a hard disk drive. The core circuit is additionally configured to amplify a high-frequency component of a sensing signal of the resistive sensor, which indicates the fly height. The low-frequency recovery circuit is configured to amplify a low-frequency component of the sensing signal.

A second aspect relates to a circuit, including a core and low-frequency recovery circuits. The core circuit includes a pair of amplifiers, a voltage-biasing digital-to-analog converter, a first pair of transistors having control terminals coupled to the voltage-biasing digital-to-analog converter, a second pair of transistors having control terminals coupled to a respective one of the pair of amplifiers, a resistive sensor coupled to the pair of transistors, and a first pair of resistors coupled to the pair of transistors. The low-frequency recovery circuit includes a current offset digital-to-analog converter, a third pair of transistors having control terminals coupled to a respective one of the pair of amplifiers, and a second pair of resistors coupled to the current offset digital-to-analog converter and the third pair of transistors.

A third aspect relates to a circuit, including a core circuit, a first low-frequency recovery circuit, and a second low-frequency recovery circuit. The core circuit includes a pair of amplifiers, a current biasing digital-to-analog converter, a first pair of transistors having control terminals coupled to the current biasing digital-to-analog converter, a second pair of transistors having control terminals coupled to a respective one of the pair of amplifiers, the second pair of transistors set such that a current flowing through each is constant and equal to an expected current, a resistive sensor coupled to the first pair of transistors and biased in accordance with the expected current, and a first pair of resistors coupled to the second pair of transistors. The first low-frequency recovery circuit includes a first common resistor, a third pair of transistors, wherein a first set of terminals of the third pair of transistors is coupled to terminals of the first common resistor, and wherein a control terminal of each of the third pair of transistors is coupled to a respective one of the pair of amplifiers and a respective control terminal of an associated transistor of the second pair of transistors, and a second pair of resistors coupled to the third pair of transistors. The second low-frequency circuit includes a second common resistor, a fourth pair of transistors, wherein a first set of terminals is coupled to terminals of the second common resistor, and a second set of terminals of the fourth pair of transistors is coupled to the second pair of resistors, and a voltage offset digital-to-analog converter coupled to control terminals of the fourth pair of transistors.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 20 shows the low-frequency path signal.

DETAILED DESCRIPTION OF ILLUSTRATIVE EMBODIMENTS

Figure 1:
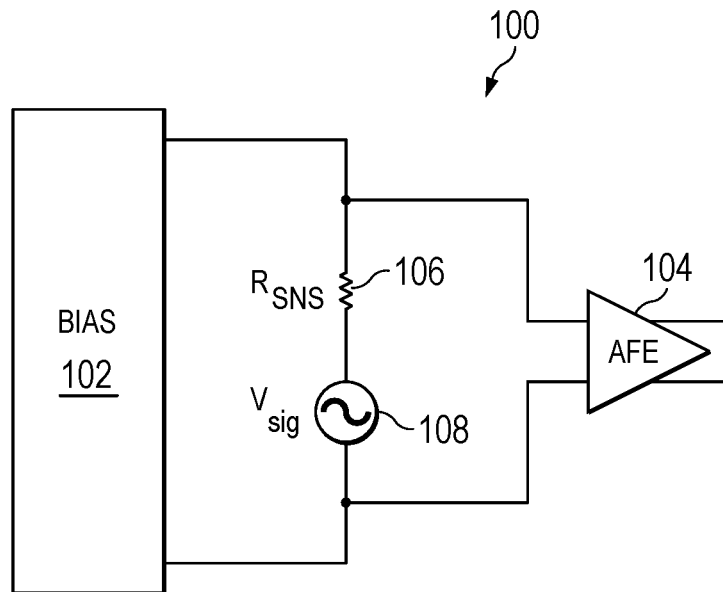
FIG. 1 is a block diagram of a circuit for biasing a resistive sensor and reading the sensing voltage.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a resistive sensor, it should also be appreciated that these inventive aspects may also apply to the biasing of other types of circuits. In particular, aspects of this disclosure may apply to sensors used for measuring the fly height distance of a disk drive head over a disk or in a preamplifier of a hard disk drive (HDD) device.

In embodiments, an analog front-end circuit for low-resistance sensors, based on a closed-loop bias circuit with a high-impedance output is disclosed. Aspects of the disclosure, provide a closed-loop biasing circuit and a noise-canceling technique to reduce the system noise at the low-frequency band, roughly corresponding to a frequency range between 100 hertz and 30 kilohertz, and without impacting system performance at the higher frequencies. In embodiments, the closed-loop biasing circuit is used to bias a resistive sensor. The closed-loop biasing circuit provides an accurate biasing of the resistive sensor without component calibration.

In embodiments, the low-frequency and high-frequency components of the sensor signal are extracted and amplified through two separate read-out paths. In embodiments, the two signal paths are combined to reduce the noise in the low-frequency band. In embodiments, the reduction in noise at the low-frequency band is greater than 25 dB. In embodiments, each signal path includes a respective amplifier having substantially the same (i.e., less than 1% gain difference). In embodiments, where the gain difference is as large as 5%, the reduction in noise at the low-frequency band remains greater than 25 dB.

Advantageously, the biasing circuit disclosed is simple in design and low in area consumption. The simplicity of the design provides ease in the management of the different states and conditions of the system. Further, in embodiments, no switching is required between wide and tight bias bandwidths (i.e., due to the fixed bias loop bandwidth configuration), which results in lower noise and disturbances along the signal chain. Moreover, as the bias bandwidth is inversely proportional to bias settling time, by creating a high-frequency path output and summing the low-frequency and the high-frequency components of the sensor signal, a bias bandwidth is provided that is large enough to have a low bias settling time while operating across the full bandwidth of the signal chain.

Aspects of the disclosure advantageously provide embodiments that make available a low-frequency transfer function and a high-frequency transfer function, individually or simultaneously, in voltage or current bias operating modes for the resistive sensor of either the single-ended or the differential type. In embodiments, a low-pass transfer function is provided to cancel the DC bias—the low-pass transfer function operating from DC to high-frequency (e.g., megahertz range). In various embodiments, the cancelation of the DC bias is performed without affecting the biasing on the resistive sensor(s) (i.e., the biasing of the resistive sensor(s) is independent of the DC bias cancellation). In embodiments, a negligible ripple is observed in the bandwidth. In embodiments, a DC (i.e., low-frequency component) coupled signal chain output and an AC (i.e., high-frequency component) coupled signal chain output are available in the current or voltage bias modes. These and further details are discussed in greater detail below.

FIG. 1 illustrates a block diagram of circuit 100 for biasing a resistive sensor ($R_{SNS}$) 106 and reading the sensing voltage ($V_{sig}$) at node 108. Circuit wo includes a biasing circuit 102 and an analog front-end (AFE) circuit 104 coupled to the resistive sensor 106, which may (or may not) be arranged as shown. Circuit 100 may include additional components not shown. A detailed description of circuit 100 is provided in U.S. Pat. No. 10,965,254, which is incorporated herein by reference in its entirety.

Sensors are widely used devices in electronic systems to measure different physical quantities, such as temperature, pressure, and force. Resistive elements are commonly used as sensors due to their inexpensive fabrication and simple interfacing with signal-conditioning circuits.

The resistive sensor 106, commonly represented as a thermal varying resistor, is placed on the read and write head of the hard disk drive. The resistive sensor 106 monitors the fly height between the disk drive head and the disk itself. To properly operate the hard disk drive, the resistive sensor 106 is biased with a constant voltage (or current). In response to the disk drive head approaching the disk, the disk acts as a heat sinker. The resistance of the resistive sensor 106 varies from the heat, represented as the voltage signal ($V_{sig}$) or a current associated with the resistive sensor 106. The voltage signal ($V_{sig}$) is filtered and amplified to measure the fly height precisely. Proper filtering and amplification become crucial as the voltage signal ($V_{sig}$) is typically small.

The biasing circuit 102 is coupled to the resistive sensor 106. Biasing circuit 102 applies a voltage (or current) bias to resistive sensor 106. The analog front-end circuit 104 amplifies the sensing voltage ($V_{sig}$). The output of the analog front-end circuit 104 is coupled to a controller that processes the amplified sensing voltage ($V_{sig}$) to determine, for example, the fly height of the hard disk drive.

Conventionally, voltage dividers or Wheatstone bridges have been used to bias the resistive sensor 106. Disadvantageously, process variations in the resistive sensor 106 and the circuit biasing components significantly impact the accuracy (i.e., inaccuracy) of the bias voltage applied to the resistive sensor 106. The adverse impact is more substantial when biasing a low-resistance resistive sensor (i.e., low resistance sensors). Calibration of the bias circuit is, thus, required to provide an accurate desired bias voltage. However, calibration of the bias circuit is undesirable due to the added cost and time associated with calibrating the circuit in production.

It is desirable for the biasing circuit 102 to drive significant currents with low noise, which typically requires components that take a sizable circuit footprint. Further, it is desirable for the biasing circuit 102 to have a low bandwidth (i.e., low bias circuit cut-off frequency); preferably, lower than the bandwidth of the analog front-end circuit 104, which, likewise, requires components that take a sizable circuit footprint.

It is also desirable for the analog front-end circuit 104 to have low noise and a wide bandwidth transfer function to process the sensing voltage ($V_{sig}$), which requires components with a significant circuit footprint.

The resistive sensor 106, thus, is biased using an analog loop, which typically has a bandwidth in the tens of kilohertz. Generally, sensing voltage ($V_{sig}$) signals higher than the bias bandwidth (i.e., high-frequency component ($V_{HF}$)) can be extracted, amplified, and processed. However, it is desirable to extract the sensing voltage ($V_{sig}$) signals lower than the bias bandwidth (i.e., low-frequency component ($V_{LF}$)—DC to bias bandwidth).

Figure 2:
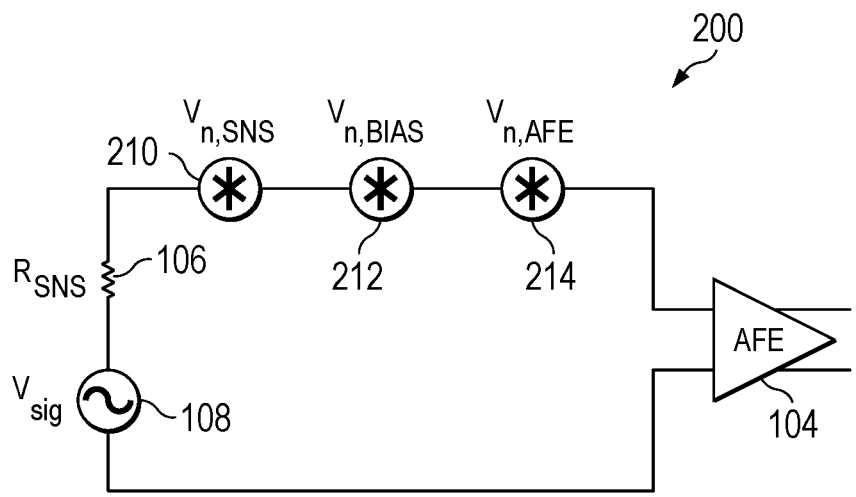
FIG. 2 is a diagram of system-level noise in the circuit of FIG. 1.

FIG. 2 illustrates a diagram of system-level noise in circuit 100. Generally, the overall noise in circuit boo plays a significant role in designing the biasing circuit 102 and the analog front-end circuit 104 for the resistive sensor 106, particularly in high-precision applications. As shown, the relevant noise sources in circuit 100 include the sensor noise ($V_{n,\ SNS}$) 210 from the resistive sensor 106, the bias noise ($V_{n,\ BIAS}$) 212 from the biasing circuit 102, and the analog front-end noise ($V_{n,\ AFE}$) 214 from the analog front-end circuit 104.

Various signal conditioning techniques, such as chopper and instrumentation amplifiers or direct-digital architectures, can be used to attenuate the analog front-end noise ($V_{n,\ AFE}$) 214. However, the bias noise ($V_{n,\ BIAS}$) 212 represents a considerable portion of the system-level noise, particularly when using a closed-loop biasing approach to achieve high accuracy of the bias voltage applied to the resistive sensor 106. In embodiments, the disclosure provides an analog front-end architecture that exploits a noise canceling technique to reduce the bias noise ($V_{n,\ BIAS}$) 212.

In U.S. Pat. No. 10,965,254, a circuit and a system are proposed that address some of the disadvantageous present in circuit loft For example, the circuit and system allow a voltage and current differential bias mode, a common-mode voltage bias with a high impedance load, an AC-coupled signal, and, with a proper cancelation routine, a DC-coupled signal.

Using the high-impedance approach, the low-frequency component ($V_{LF}$) can be easily extracted from the resistive sensor pins under the current bias operation mode. Under the voltage bias operation mode, the biasing of the resistive sensor 106 (shown as a differential resistor) is done with loops setting differential and common mode voltage at the terminals of resistive sensor 106. The low-frequency component ($V_{LF}$) under voltage bias operation mode, can be extracted from selected nodes, but contains also the DC bias component. The cancelation routine supposes a pre-defined differential current bias that generates the correct differential voltage to be applied to the low-frequency signal chain and to properly cancel the DC offset at the signal chain output.

The circuit and system proposed in U.S. Pat. No. 10,965,254 do not include a low-frequency transfer function in the voltage and current bias modes (i.e., only one mode is present), provide the ability to bias two low resistive sensors operating as single-ended loads and have no current capability for the common-mode voltage biasing or common-mode current biasing. In addition, the AC and DC coupled signal paths are the same (i.e., cannot extract the high and low-frequency components separately). Further, a calibration procedure is required to apply the bias for the DC-coupled signal mode. Moreover, a small dynamic range is allowed for the resistive sensor 106.

In embodiments, this disclosure provides a closed-loop biasing technique to accurately drive a resistive sensor without the additional calibration step required in conventional devices. Aspects of this disclosure provide a circuit, system, and method that can be used to cancel the DC bias, flatten the gain across the frequency range, independently make the high-frequency component ($V_{HF}$) and the low-frequency component ($V_{LF}$) available (i.e., to separately extract, amplify, and process), allow the biasing of the resistive sensor 106 using a voltage bias, a current bias, or both while maintaining (or reducing) the overall noise of the system (i.e., low noise desirable).

Aspects of this disclosure provide a circuit that includes a biasing circuit and a first amplifier stage. The circuit is configurable to apply a common-mode voltage (or current) to two low-impedance single-ended sensors, extract, and amplify the sensing voltage ($V_{sig}$) from each sensor with variations and across bandwidths. In some embodiments, the circuit includes a band-pass transfer function with a high-pass filter (e.g., in the order of kilohertz) and a low-pass filter (e.g., in the order of tens of megahertz). In embodiments, the circuit includes a low-pass transfer function (e.g., from DC to megahertz). In embodiments, the band-pass transfer function and the low-pass transfer function are available simultaneously in the current bias operating mode. In various embodiments, the circuit has a low-noise performance characteristic. In embodiments, the circuit is compatible with the circuit and system introduced in U.S. Pat. No. 10,965,254. In some embodiments, the fly height sensor can switch between the different operating modes, where the same circuit or sub-circuits of the circuit can be used in different configurations.

Figure 3:
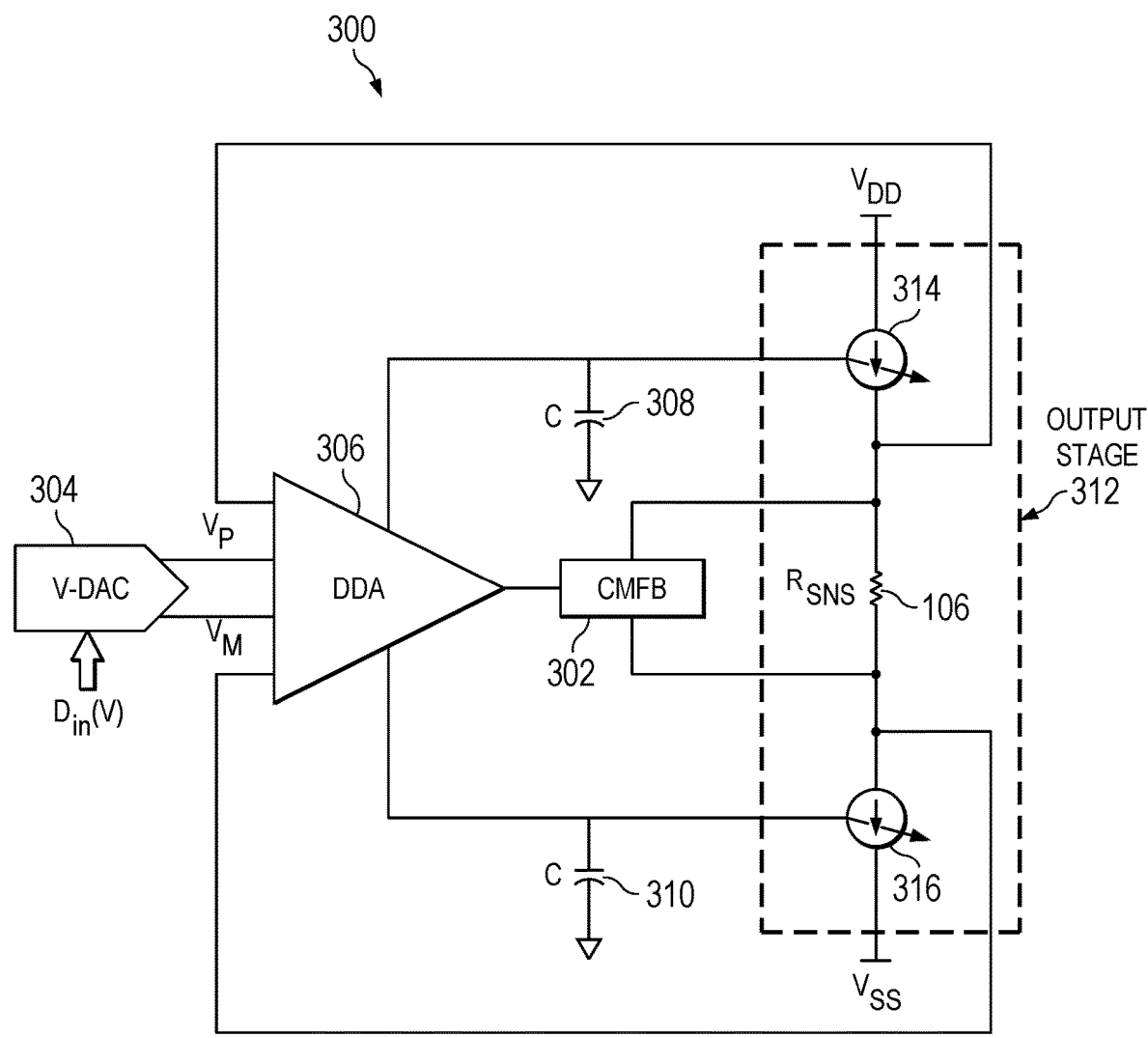
FIG. 3 is a block diagram of an embodiment closed-loop biasing circuit.

FIG. 3 illustrates a block diagram of an embodiment closed-loop biasing circuit 300. In embodiments, closed-loop biasing circuit 300 operates as a fully differential voltage buffer to control differential and common-mode components of a system. In embodiments, closed-loop biasing circuit 300 uses a bias feedback loop circuit 302 to set the desired common mode voltage value across the terminals of the resistive sensor 106. The differential voltage across the terminals of the resistive sensor 106 is set using the differential difference amplifier 306.

Closed-loop biasing circuit 300 includes the bias feedback loop circuit 302, a voltage mode digital-to-analog converter (V-DAC) 304, a differential difference amplifier (DDA) 306, a capacitor 308, a capacitor 310, and an output stage 312, which may (or may not) be arranged as shown. In embodiments, the bias feedback loop circuit 302 is a common-mode feedback (CMFB) circuit. As shown, the output stage 312 includes the resistive sensor 106 and the first current sink 314 coupled to a first voltage source ($V_{DD}$) and a second current sink 316 coupled to a second voltage source ($V_{SS}$). Closed-loop biasing circuit 300 may include additional components not shown.

In embodiments, voltage mode digital-to-analog converter 304 applies the desired sensor bias voltages (i.e., $V_P$ and $V_M$) at the inputs of the differential difference amplifier 306. The differential difference amplifier 306 drives the output stage 312. The bias feedback loop circuit 302 controls the common-mode voltage at the output of the differential difference amplifier 306 and consequently controls the common-mode voltage at the terminals of resistive sensor 106. The differential loop, involving differential difference amplifier 306, guarantees that the desired sensor bias voltages (i.e., $V_P$ and $V_M$) are accurately replicated across the terminals of the resistive sensor 106.

In embodiments, the output stage 312 includes a first current sink 314 and a second current sink 316. The first current sink 314 is coupled to the first voltage ($V_{DD}$) and the second current sink 316 is coupled to the second voltage source ($V_{SS}$). The resistive sensor 106 is coupled between the first current sink 314 and the second current sink 316. The output stage 312 may be implemented as the low-output impedance structure as shown in FIG. 4A or the high-output impedance structure as shown in FIG. 4B.

Figure 4A:
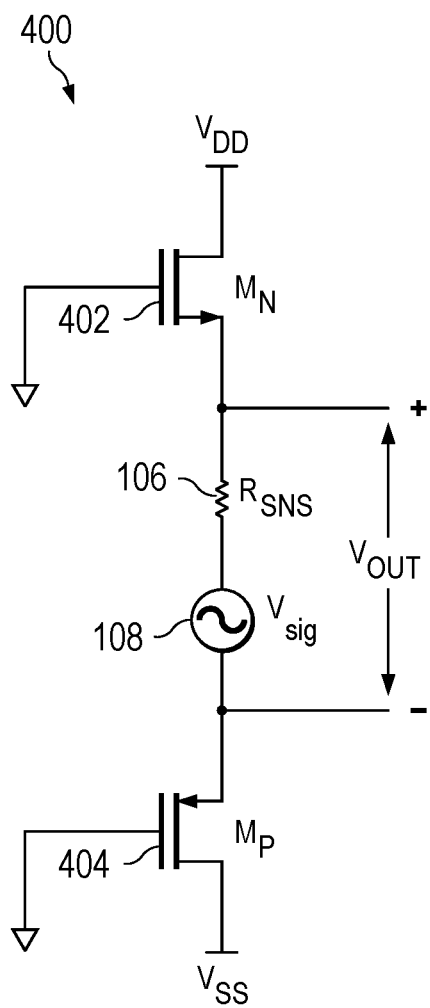
FIGS. 4A-B are block diagrams of embodiment output stages.
Figure 4B:
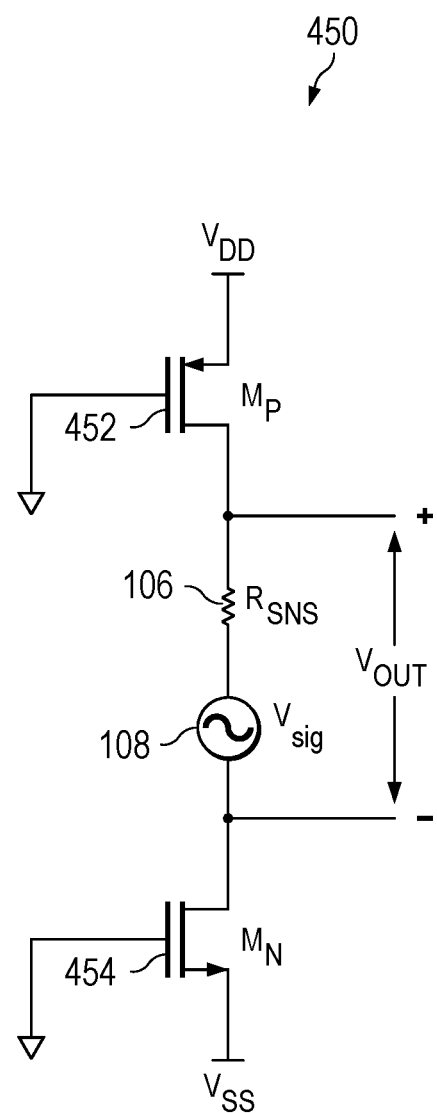

FIGS. 4A-B, respectively, illustrate block diagrams of embodiment output stage 400 and output stage 450, which may be implemented as the output stage 312 of the closed-loop biasing circuit 300. The output stage 400 is implemented as a low-output impedance (LowZi) structure. The output stage 450, in contrast, is implemented as a high-output impedance (HighZi) structure.

Output stage 400 includes a first transistor 402, a second transistor 404, and the resistive sensor 106 coupled in between. As shown, the first transistor 402 is an N-type metal-oxide-semiconductor field-effect transistor (MOSFET) and the second transistor 404 is a P-type MOSFET. The control terminal of the first transistor 402 is coupled to the capacitor 308, and the control terminal of the second transistor 404 is coupled to the capacitor 310. The drain terminal of the first transistor 402 is coupled to the first voltage source ($V_{DD}$), and the drain terminal of the second transistor 404 is coupled to the second voltage source ($V_{SS}$). The source terminal of the first transistor 402 is coupled to the first terminal of the resistive sensor 106 and the source terminal of the second transistor 404 is coupled to a second terminal of the resistive sensor 106.

Output stage 450 includes a first transistor 452, a second transistor 454, and the resistive sensor 106 coupled in between. As shown, the first transistor 452 is a P-type metal-oxide-semiconductor field-effect transistor (MOSFET) and the second transistor 454 is an N-type MOSFET. The control terminal of the first transistor 452 is coupled to the capacitor 308, and the control terminal of the second transistor 454 is coupled to the capacitor 310. The source terminal of the first transistor 452 is coupled to the first voltage source ($V_{DD}$), and the source terminal of the second transistor 454 is coupled to the second voltage source ($V_{SS}$). The drain terminal of the first transistor 452 is coupled to the first terminal of the resistive sensor 106 and the drain terminal of the second transistor 454 is coupled to a second terminal of the resistive sensor 106.

Output stage 400 and output stage 450 may be functionally identical from the sensor biasing point of view. However, the different impedance structure types lead to different transfer functions for signals at frequencies larger than the cutoff frequency of the bias feedback loop circuit 306, which is determined by capacitor 308 and capacitor 310.

For example, the transfer function for the output stage 400 can be represented by equation (1):

$$\left.\frac{V_{out}}{V_{sig}}\right|_{LowZi} = \frac{\frac{1}{g_{m,n}} + \frac{1}{g_{m,p}}}{\frac{1}{g_{m,n}} + \frac{1}{g_{m,p}} + R_{SNS}},$$

where $g_{m,n}$ and $g_{m,p}$ represent, respectively, the transconductance of the first transistor 402 and the second transistor 404, $V_{out}$ is the voltage across the terminal of the resistive sensor 106, $V_{sig}$ is the sensor signal at node 108, and $R_{SNS}$ is the resistance value of the resistive sensor 106.

And, for example, the transfer function for the output stage 450 can be represented by equation (2):

$$\left.\frac{V_{out}}{V_{sig}}\right|_{HighZi} = \frac{\frac{1}{g_{ds,n}} + \frac{1}{g_{ds,p}}}{\frac{1}{g_{ds,n}} + \frac{1}{g_{ds,p}} + R_{SNS}} \approx 1,$$

where $g_{ds,n}$ and $g_{ds,p}$ represent, respectively, the output conductance's of the first transistor 402 and the second transistor 404, $V_{out}$ is the voltage across the terminals of the resistive sensor 106, $V_{sig}$ is sensor signal at node 108, and $R_{SNS}$ is the resistance value of the resistive sensor 106.

Generally, as $$\frac{1}{g_{ds,n}} + \frac{1}{g_{ds,p}} \gg R_{SNS},$$

the sensor signal ($V_{sig}$), in the high-output impedance (HighZi) structure, is transferred across the terminals of the resistive sensor 106 without any attenuation, which is independent of (i) the resistance value of the resistive sensor 106 and (ii) the process and temperature variations of the closed-loop biasing circuit 300. This is in contrast to the low-output impedance (LowZi) structure, where $$\frac{1}{g_{m,n}} + \frac{1}{g_{m,p}} \cong R_{SNS}.$$

Thus, a closed-loop biasing circuit 300 having an output stage 450 is preferred over the implementation of a closed-loop biasing circuit 300 having the output stage 400.

Generally, the bias feedback loop circuit 302 acts as a low-pass filter to inherently cancel low frequency (i.e., LF signal) components of the sensor signal ($V_{sig}$) up to the cutoff frequency ($f_{FB}$). The high frequency (i.e., HF signal) components of the sensor signal ($V_{sig}$), greater than the feedback frequency ($f_{FB}$), are unaltered at the output terminals ($V_{out}$)—see equation (2) and, thus, equal to $V_{HF}$. However, the low frequency components can be recovered from the shared terminals between the output stage and the capacitors 308 and 310. The DC transfer functions $V_{A,B}/V_{sig}$ feature a low pass behavior with the cutoff frequency ($f_{FB}$) and an in-band gain dependent on $R_{SNS}$, $g_{m,n}$, $g_{m,p}$, and $A_o$, where $A_o$, is the DC gain of the differential difference amplifier 306.

The DC transfer function for $V_A/V_{sig}$ can be represented by equation (3):

$$\frac{V_A}{V_{sig}} = \frac{A_0}{1 + A_0 \times g_{m,p} \times R_{SNS}} \approx \frac{1}{g_{m,p} \times R_{SNS}}.$$

Similarly, the DC transfer function for $V_B/V_{sig}$ can be represented by equation (4):

$$\frac{V_B}{V_{sig}} = \frac{A_0}{1 + A_0 \times g_{m,n} \times R_{SNS}} \approx \frac{1}{g_{m,n} \times R_{SNS}}.$$

In embodiments, the DC transfer function values are compensated using a gain recovery circuit.

In embodiments, the gain recovery circuit used is used to create a constant gain independent of the resistive sensor 106 and independent of the characteristics of the bias circuit elements (e.g., variations in process and temperature). Accordingly, the gain recovery circuit compensates for the effected stages.

Figure 5:
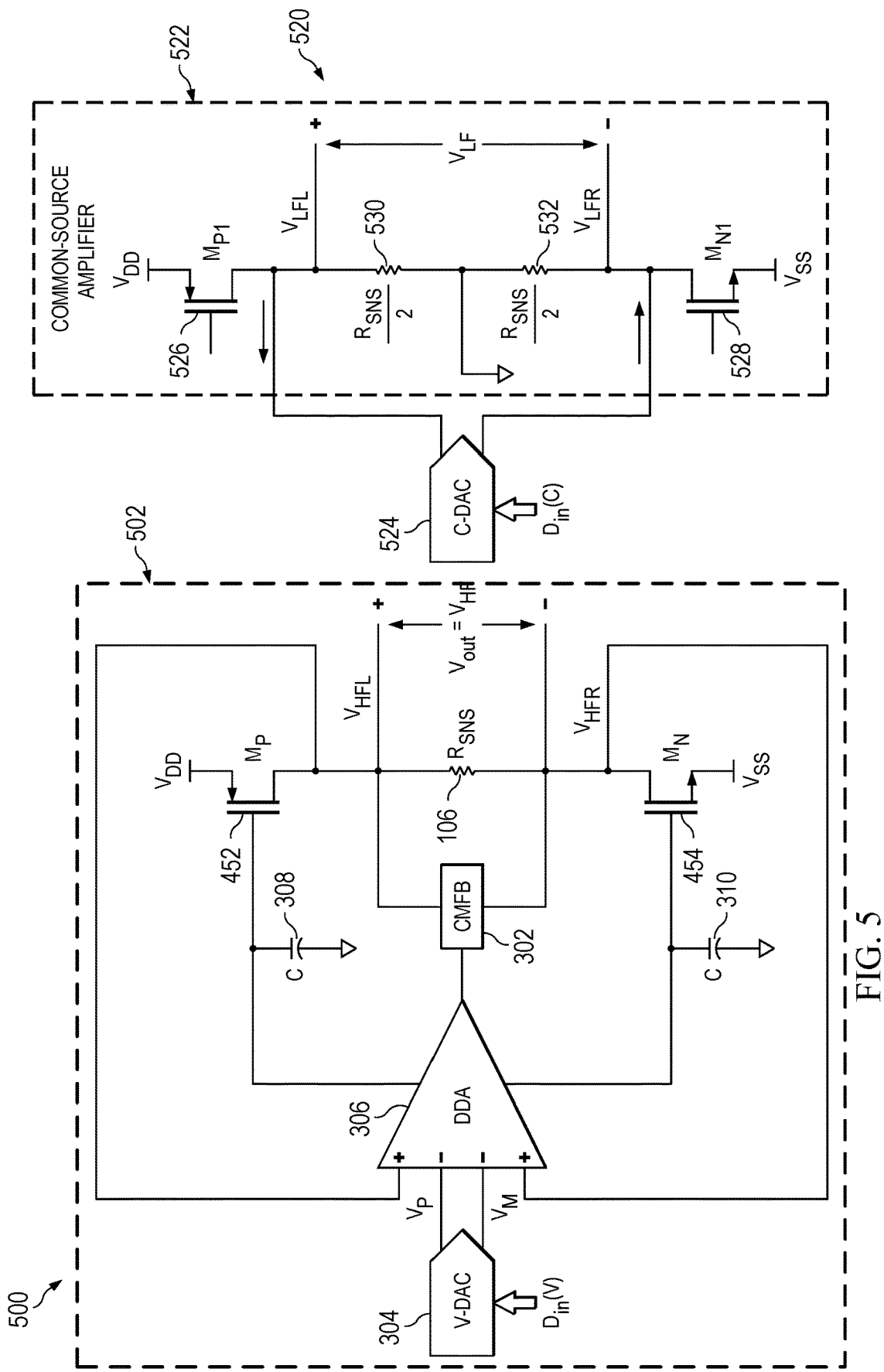
FIG. 5 is a block diagram of an embodiment circuit, which includes a biasing circuit and a gain recovery circuit.

FIG. 5 illustrates a block diagram of an embodiment circuit 500, which includes a biasing circuit 502 and a gain recovery circuit 520. The biasing circuit 502 is similar to the closed-loop biasing circuit 300, with the output stage 450 implemented as the output stage 312. As detailed herein above, the voltage at the output terminals ($V_{out}$) is approximately equal to $V_{HF}$.

Gain recovery circuit 520 includes a common source amplifier 522 coupled to a current mode digital-to-analog converter (C-DAC) 524. Common source amplifier 522 includes a first transistor 526, a second transistor 528, a first resistor 530, and a second resistor 532.

In embodiments, the first resistor 530 and the second resistor 532 have a resistance value equal to ½ of the resistance of the resistive sensor 106. In embodiments, the first transistor 526 and the second transistor 528 are replicas of the first transistor 452 and second transistor 454, respectively. In embodiments, the first resistor 530 and second resistor 532 have a different resistance value than the resistive sensor 106.

The control terminal of the first transistor 526 is coupled to the shared node between the first transistor 452 and the capacitor 308, and the control terminal of the second transistor 528 is coupled to the shared node between the second transistor 454 and the capacitor 310. The source terminal of the first transistor 526 is coupled to the first voltage source ($V_{DD}$), and the source terminal of the second transistor 528 is coupled to the second voltage source ($V_{SS}$). The drain terminal of the first transistor 526 is coupled to a first output of the current mode digital-to-analog converter 524 and a first terminal of the first resistor 530. The drain terminal of the second transistor 528 is coupled to a second output of the current mode digital-to-analog converter 524 and a first terminal of the second resistor 532. The second terminal of the first resistor 530 and the second terminal of the second resistor 532 are coupled to a reference ground. The voltage across the first terminals of the first resistor 530 and the second resistor 532 is equal to the voltage $V_{LF}$.

The low-frequency gain (i.e., $V_{LF}/V_{sig}$) of the gain recovery circuit 520 depends on the ratio between the first transistor 526 and first transistor 452, second transistor 528 and second transistor 454 and independent of the aforementioned parameters. In embodiments where the first resistor 530 and the second resistor 532 have a different resistance value than the resistive sensor 106, the aforementioned gain stages compensate the gain mismatch through the gain recovery circuit.

In embodiments, the current mode digital-to-analog converter 524 is used to remove the DC bias voltages $V_P$ and $V_M$ (i.e., at the output of the voltage mode digital-to-analog converter 304) from the voltage $V_{LF}$, in addition to other undesired DC voltage components (i.e., offset) that may be present in the system.

In embodiments, the output voltages $V_{LF}$ and $V_{HF}$ have different frequency components of the sensor signal ($V_{sig}$) with a unity gain. Thus, the noise present in the output voltages $V_{LF}$ and $V_{HF}$ can be referred to as the input referred noise (IRN) of circuit 500. It should be noted that in other embodiments, the VLF gain can be different from the unity gain (i.e., "1"). The calculations below consider a unity gain for simplicity and the resulting circuit remains valid and advantageous even where the gain is not unity.

Figure 6:
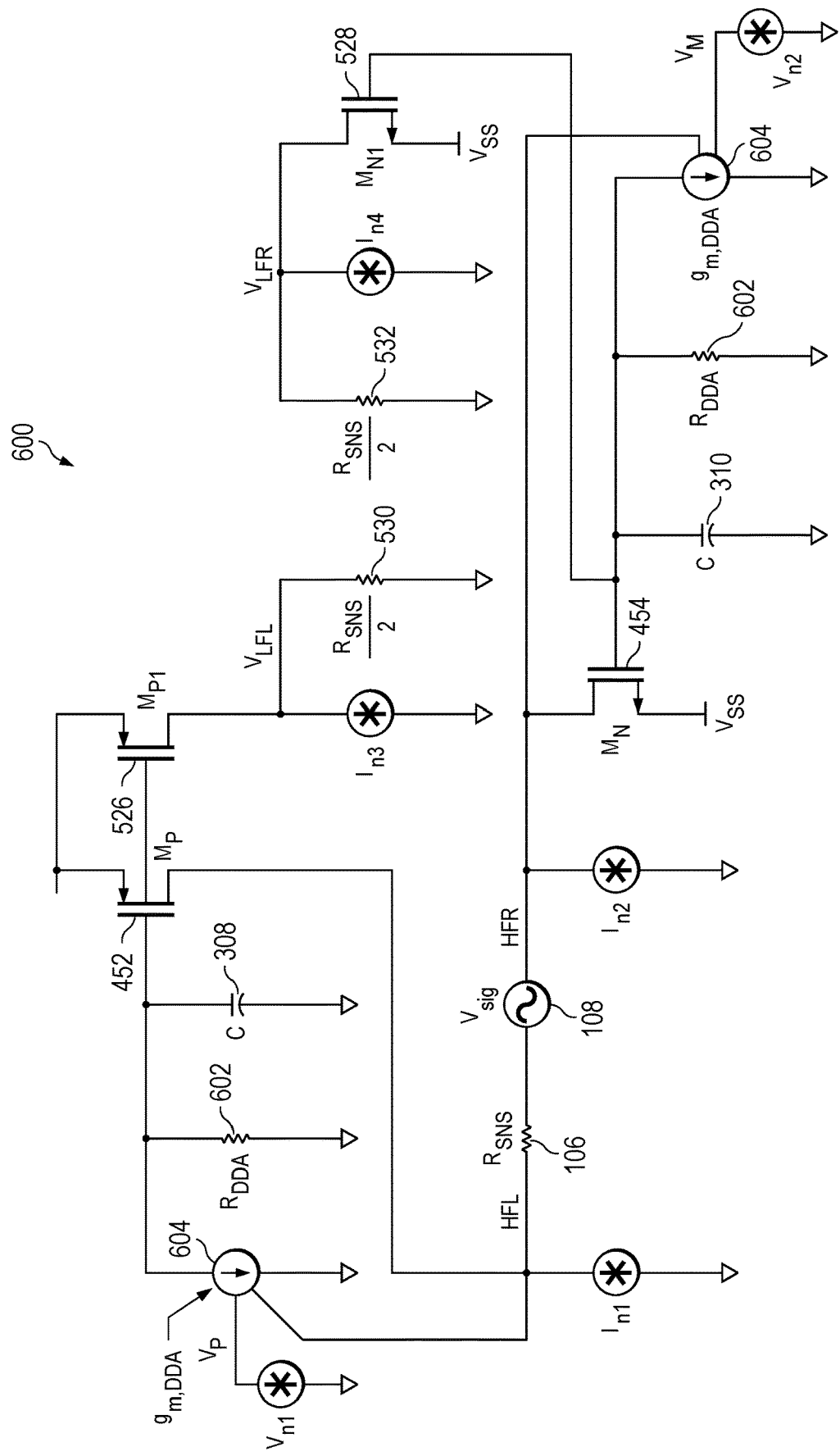
FIG. 6 is a block diagram of relevant noise sources for the circuit of FIG. 5.

FIG. 6 illustrates a block diagram of relevant noise sources for circuit 500. The low-frequency component $V_{LF}(s)$ of the noise sources with different gains can be represented by the equation (5):

$$V_{LF}(s) = (V_{sig} + V_{n1} + V_{n2}) \times H_{LF}(s) +$$
$$(I_{n1} + I_{n2} + I_{n3} + I_{n4}) \times \frac{R_{SNS}}{2} \times H_{LF}(s) + 2 \times \sqrt{4 \times k \times T \times \frac{R_{SNS}}{2}} \times H_{LF}(s),$$

where $I_{n1}$, $I_{n2}$, $I_{n3}$, and $I_{n4}$ are from, respectively, the first transistor 452, the second transistor 454, the first transistor 526, and the second transistor 528, noise sources $V_{n1}$ and $V_{n2}$ are noise from the differential difference amplifier 306, and $$H_{LF}(s) = \frac{V_{LF}(s)}{V_{sig}(s)} = \frac{A(s) \times g_{m,p} \times R_{SNS}}{1 + A(s) \times g_{m,p} \times R_{SNS}}, \text{ where } A(s) = \frac{g_{m,DDA} \times R_{DDA}}{1 + R_{DDA} \times C(s)}.$$

And, $g_{m,DDA}$ 604 is the input transconductance of the differential difference amplifier 306, the resistance $R_{DDA}$ 602 is the output resistance of the differential difference amplifier 306, and C(s) is the capacitance of the capacitors 308 and 310. The low-frequency component $V_{LF}(s)$ significantly increases the root-mean-square (RMS) noise in the frequency range of the low-frequency signal.

The high-frequency component $V_{HF}(s)$ can be represented by the equation (6):

$$V_{HF}(s) = V_{sig} \times H_{HF}(s) - (V_{n1} - V_{n2}) \times H_{HF}(s) +$$
$$(I_{n1} + I_{n2}) \times \frac{R_{SNS}}{2} \times H_{HF}(s) + 2 \times \sqrt{4 \times k \times T \times \frac{R_{SNS}}{2}} \times H_{HF}(s),$$
$$\text{where } H_{HF}(s) = \frac{V_{HF}(s)}{V_{sig}(s)} = \frac{1}{1 + A(s) \times g_{m,p} \times R_{SNS}}.$$

The high-frequency component $V_{HF}(s)$ is mainly determined by $I_{n1}$ and $I_{n2}$ since the low-frequency differential difference amplifier noise has a negligible effect on the high-frequency sensor signal.

Figure 7A:
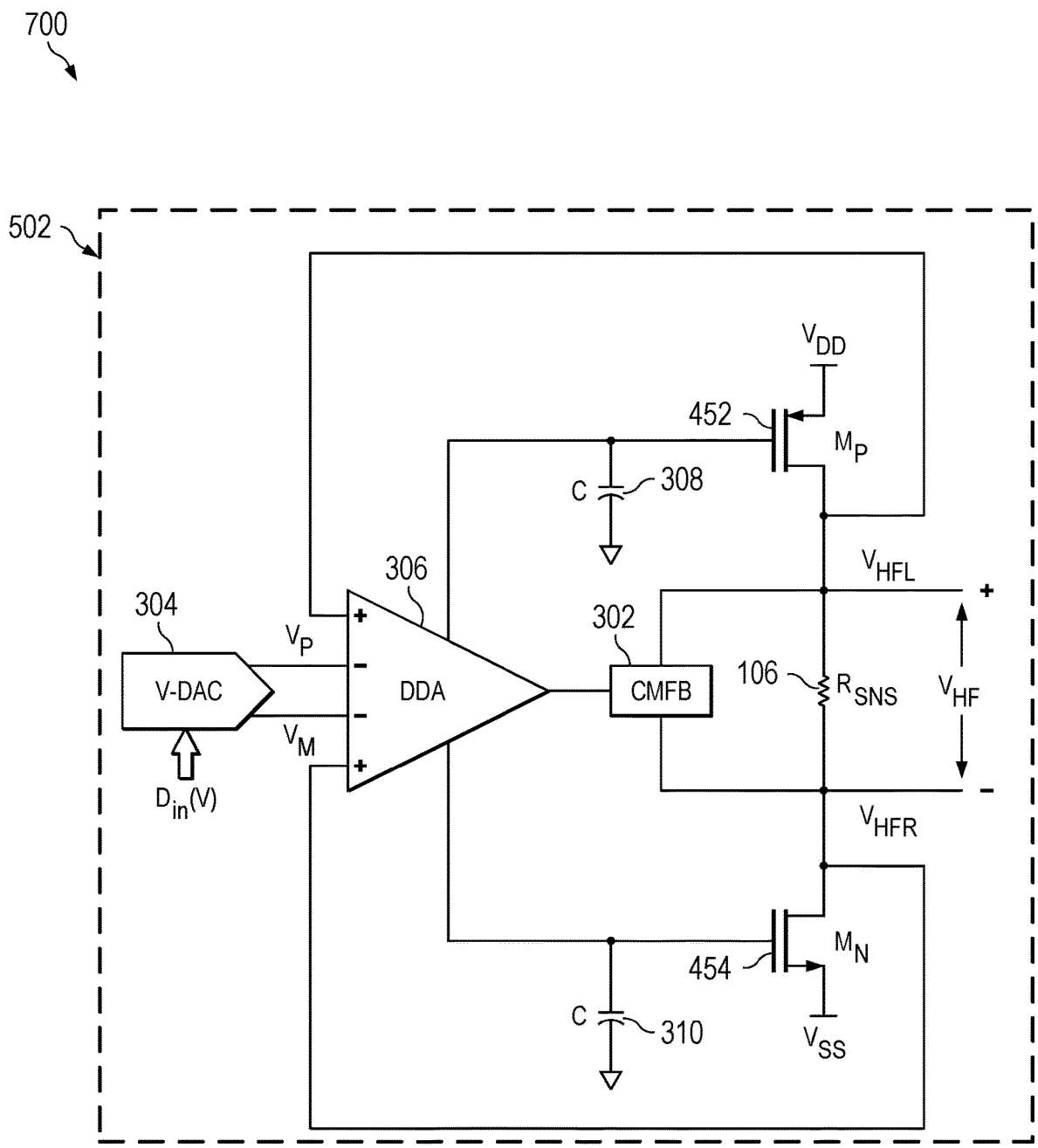
FIGS. 7A-B are block diagrams of an embodiment circuit.
Figure 7B:
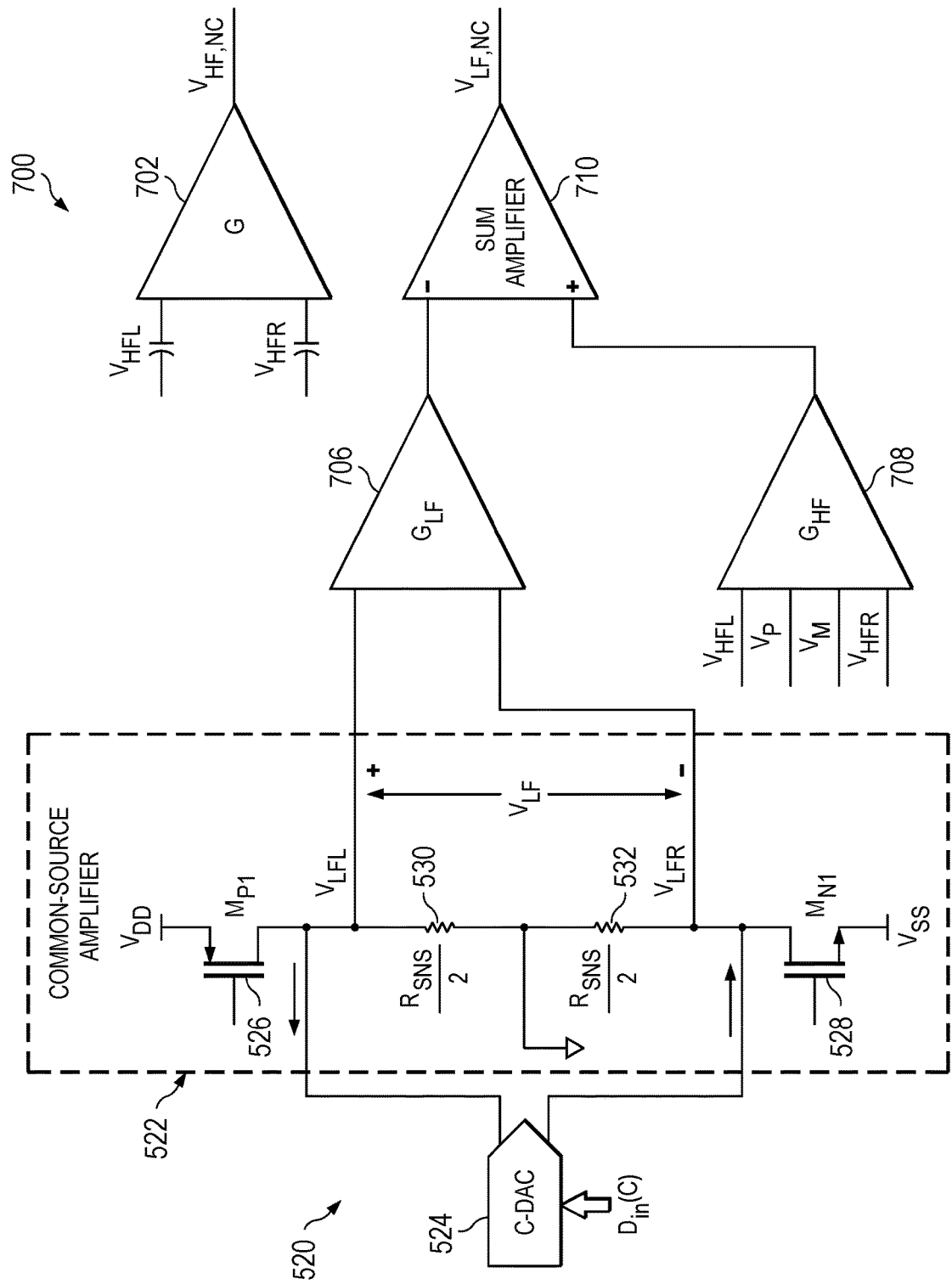

FIGS. 7A-B illustrate block diagrams of an embodiment circuit 700. In embodiments, circuit 700 is used to bias the resistive sensor 106 and read the resulting sensor signal ($V_{sig}$), while reducing the noise level in the low-frequency range. Circuit 700 includes the biasing circuit 502 and the gain recovery circuit 520 coupled to an analog front-end circuit including a first amplifier 702, a second amplifier 706, a third amplifier 708, and a fourth amplifier 710.

As illustrated by equations (5) and (6), the noise contributions from $V_{n1}$ and $V_{n2}$, which are the dominant noise contributions in the low-frequency component ($V_{LF}$), appear filtered by the same transfer function $H_{LF}$. Thus, circuit 700 effectively cancels the noise contributions by subtracting the low-frequency component ($V_{LF}$) from the high-frequency component ($V_{HF}$) of the differential output voltage across the terminals of the resistive sensor 106 and amplifying the difference by a factor of G.

The high-frequency component ($V_{HF}$) is fed as inputs to the first amplifier 702, which has a gain of $G_{HF}$. Thus, the high-frequency component ($V_{HF,NC}$) at the output of the first amplifier 702 follows the equation (7): $V_{HF,NC}=G\times V_{HF}$, assuming $G_{HF}$ equals G.

The first amplifier 702 is coupled to the terminals of the resistive sensor 106. The second amplifier 706, and the fourth amplifier 710 are coupled to the gain recovery circuit 520. The low-frequency component ($V_{LF}$) of the differential output voltage is fed as inputs to the second amplifier 706, which has a gain of $G_{LF}$. Thus, the output of the second amplifier 706 is equal to $G\times V_{LF}$, assuming $G_{LF}$ equals G.

In embodiments, the third amplifier 708 is a differential difference amplifier. The sensor bias voltage ($V_P$) and ($V_M$), from the voltage mode digital-to-analog converter 304, and the corresponding high-frequency differential output voltage across the resistive sensor 106 are fed as inputs to the third amplifier 708, which has a gain of $G_{HF}$. The outputs of the second amplifier 706 and the third amplifier 708 are fed as inputs to the fourth amplifier 710, which is also a summing amplifier.

Thus, the output signal of the fourth amplifier 710 corresponds to the equation (8):

$$V_{LF,NC}(s) = G\times V_{sig} + G\times (I_{n1}+I_{n2})\times \frac{R_{SNS}}{2} + G\times (I_{n3}+I_{n4})\times \frac{R_{SNS}}{2}\times H_{LF}(s) + 2G\times \sqrt{4\times k\times T\times \frac{R_{SNS}}{2}}\times H_{LF}(s),$$

assuming that $G_{HF}$ and $G_{LF}$ equal G and $H_{HF}(s)-H_{LF}(s)=1$. As the DC values of the differential voltage corresponding to the high-frequency component ($V_{HF}$) are equal to the sensor bias voltages $V_P$ and $V_M$, the sensor bias voltages $V_P$ and $V_M$ can be used to cancel out the bias voltage in the DC coupled amplifiers.

Figure 8:
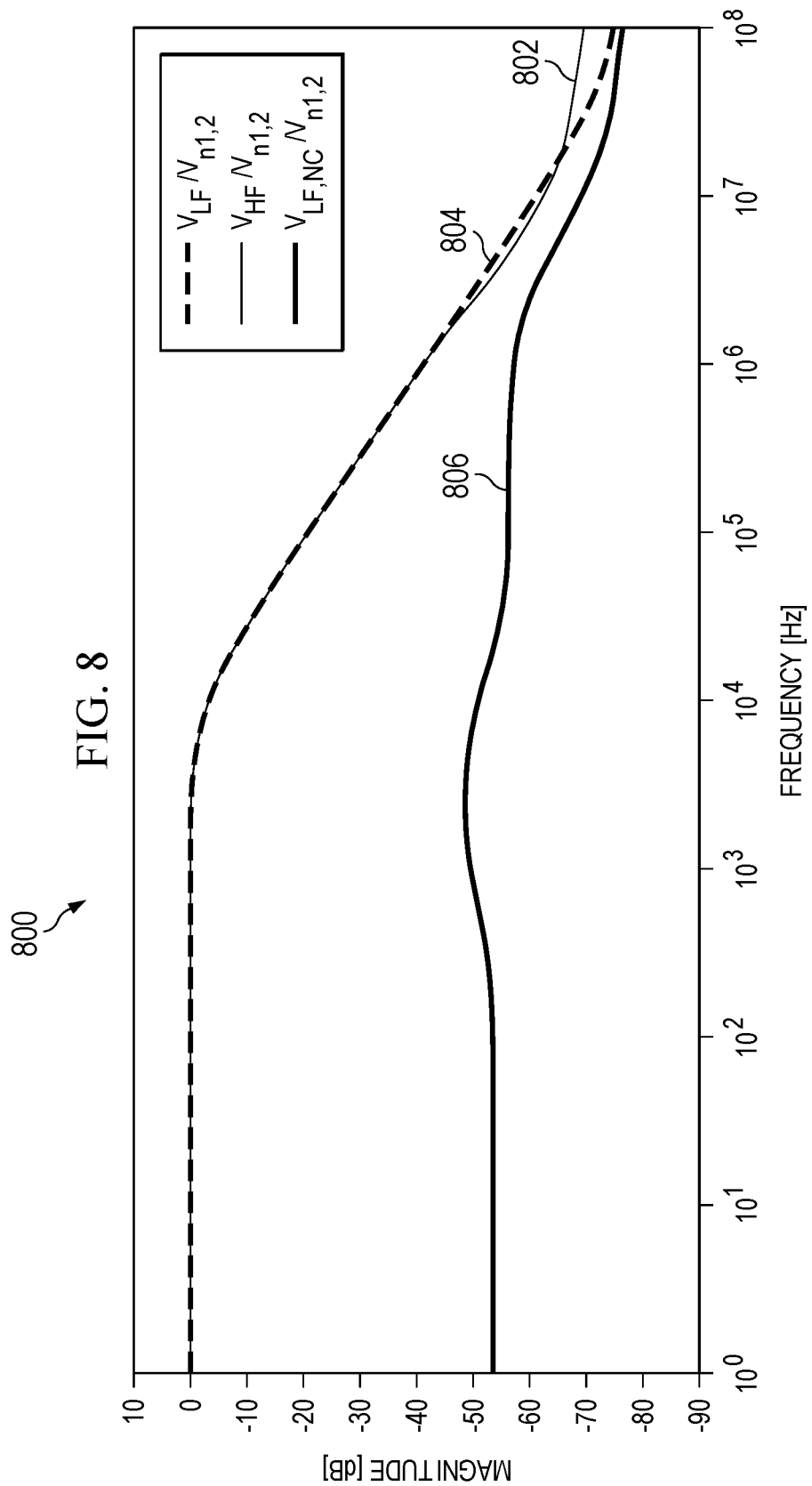
FIG. 8 shows simulated noise transfer functions with and without noise canceling techniques.

FIG. 8 illustrates simulated noise transfer functions with and without the noise canceling techniques, as disclosed in the embodiments of the present disclosure. The thermal noise of the differential difference amplifier 306 is modeled with a resistor equivalent to $2/g_{m,DDA}$.

The transfer function $V_{LF}/V_{n1,2}$ 804 is the simulated transfer function of the noise sources $V_{n1}$ and $V_{n2}$ (see FIG. 5) to the low-frequency component ($V_{LF}$). The transfer function $V_{HF}/V_{n1,2}$ 802 is the simulated transfer function of the noise sources $V_{n1}$ and $V_{n2}$ to the high-frequency component ($V_{HF}$). And, the transfer function $V_{LF,NC}/V_{n1,2}$ 806 is the simulated transfer function of the noise sources $V_{n1}$ and and $V_{n2}$ to the low-frequency component ($V_{LF,NC}$) with noise cancelation.

As shown, the low-frequency component corresponding to the transfer function $V_{LF,NC}/V_{n1,2}$ 806 is attenuated by more than 50 dB to $V_{LF}/V_{n1,2}$ 804 at below 1 kilohertz (kHz), illustrating the effectiveness of noise canceling techniques disclosed herein under the condition of $G_{HF}$ being approximately equal to $G_{LF}$.

Figure 9:
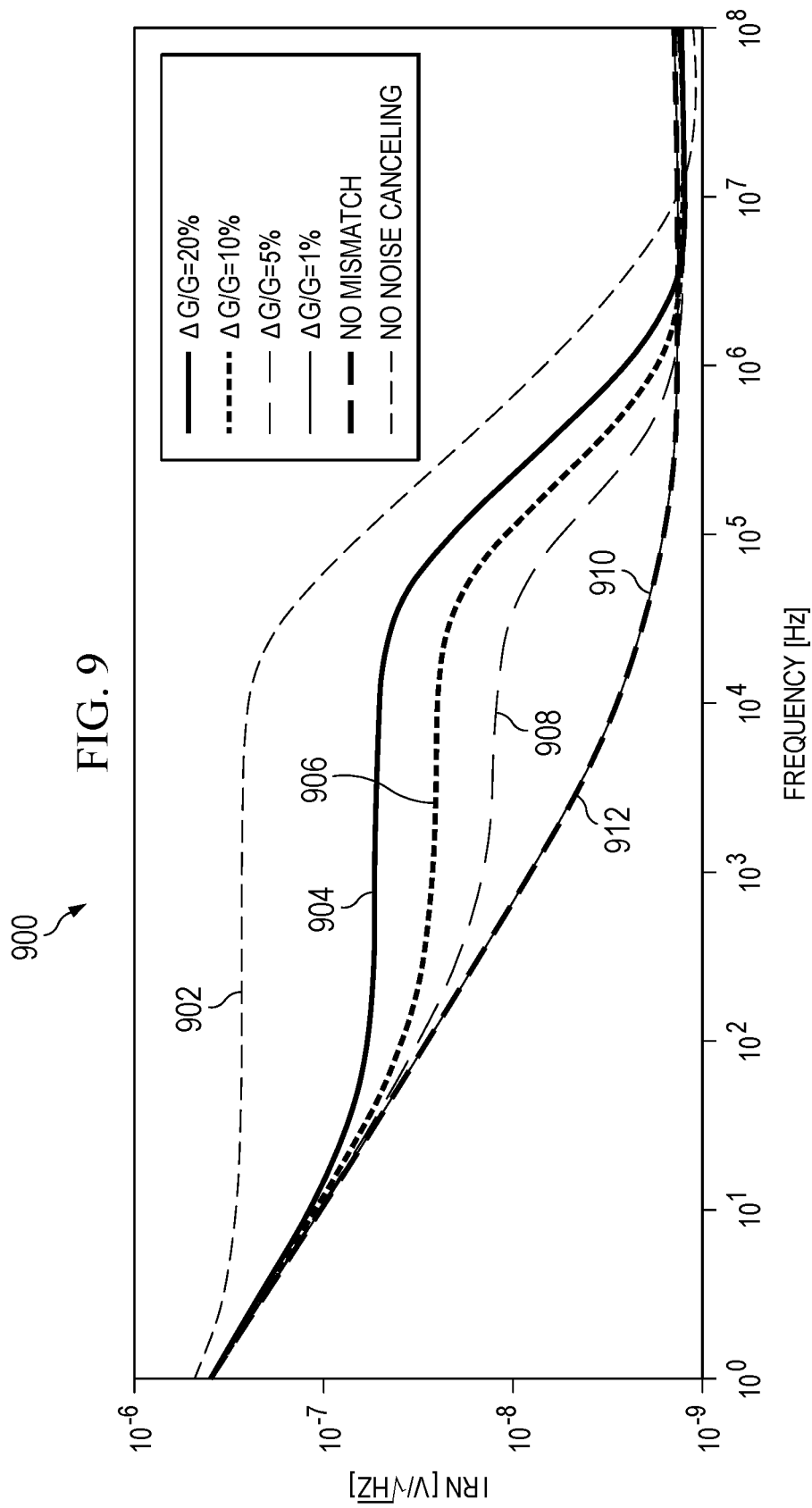
FIG. 9 is the simulated input referred noise (IRN) for the circuit of FIGS. 7A-B.

FIG. 9 illustrates the simulated input referred noise (IRN) of circuit 700 for different values of $\Delta G/G$, where $\Delta G=|G_{LF}-G_{HF}|$. As shown, no degradation of the performance is seen with respect to the ideal case for $\Delta G/G \leq 1\%$. Further, the performance improvement remains substantial for $\Delta G/G$ as large as 10%.

Graph 902 illustrates a simulated input referred noise of circuit 700 with no noise canceling. Graph 904 illustrates a simulated input referred noise of circuit 700 with $\Delta G/G$ equal to 20%. Graph 906 illustrates a simulated input referred noise of circuit 700 with $\Delta G/G$ equal to 10%. Graph 908 illustrates a simulated input referred noise of circuit 700 with $\Delta G/G$ equal to 5%. Graph 910 illustrates a simulated input referred noise of circuit 700 with $\Delta G/G$ equal to 1%. Graph 912 illustrates a simulated input referred noise of circuit 700 with no mismatch.

Table I summarizes the performance of the proposed noise canceling technique as a function of $\Delta G/G$ over different bandwidths.

| Noise | Gain Mismatch (of $\Delta G/G$) | | | | |
|---|---|---|---|---|---|
| | 0% | 1% | 5% | 10% | 20% |
| Integrated Noise ($\mu V_{rms}$) 100 Hz–30 kHz | 1.09 | 1.10 | 2.30 | 4.53 | 8.72 |
| Averaged Noise (nV/$\sqrt{Hz}$) 30 kHz–20 MHz | 1.65 | 1.66 | 1.80 | 2.28 | 2.30 |

The achieved integrated input referred noise values at a frequency bandwidth of 100 Hz to 30 kHz, corresponding to the low-frequency component, are 44 $\mu V_{rms}$ and 1.085 $\mu V_{rms}$, without and with noise canceling, respectively (i.e., 32 dB improvement).

At a mismatch corresponding to a $\Delta G/G$ as large as 5%, the performance improvement remains greater than 25 dB. At a frequency bandwidth of 30 kHz to 20 MHz, corresponding to the high-frequency component, the noise canceling techniques of circuit 700 do not significantly impact performance even at a large gain mismatch.

Figure 10:
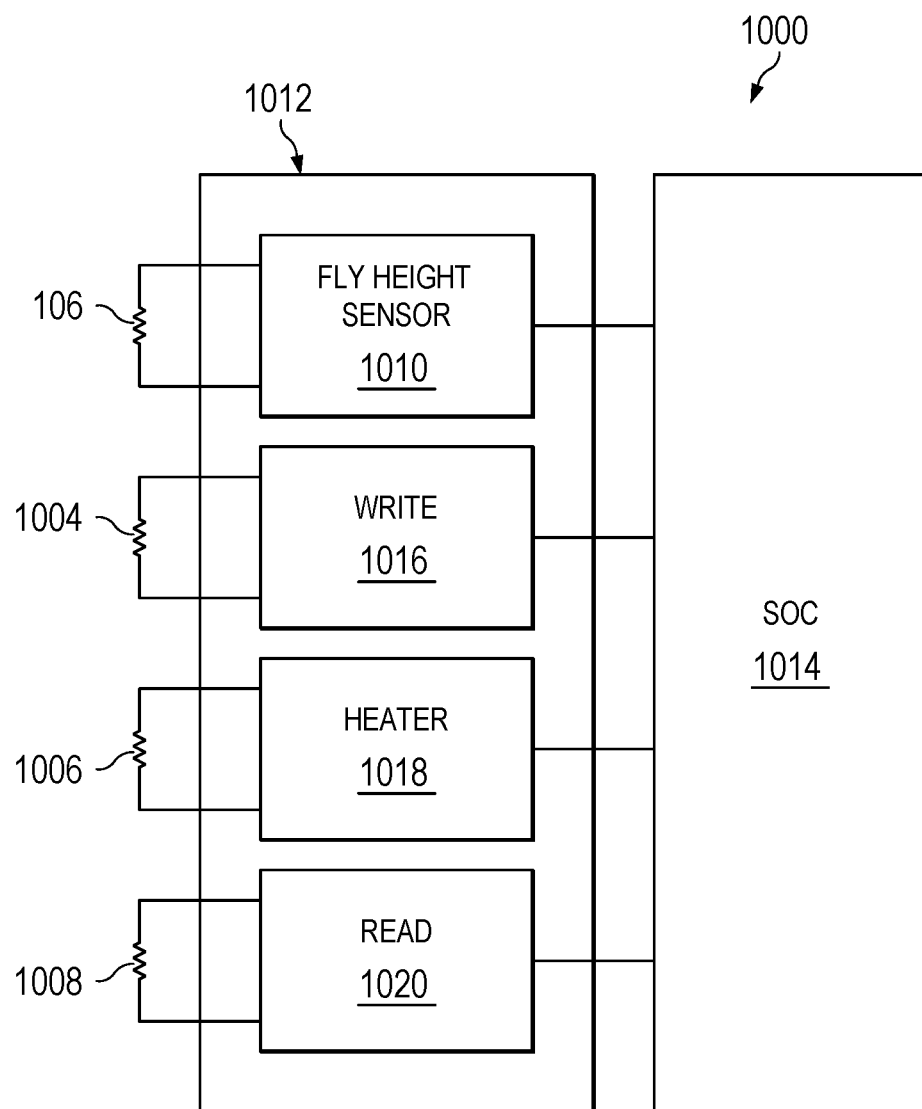
FIG. 10 is a pre-amplifier that is placed on the disk drive head stack assembly of a hard disk drive.

FIG. 10 illustrates pre-amplifier 1012 that is placed on the disk drive head stack assembly of a hard disk drive. The disk drive head stack assembly slides over the disk. The pre-amplifier 1012 includes the fly height sensor low. In embodiments, the fly height sensor low includes a biasing circuit and an amplifier (not shown). The fly height sensor low is coupled to the resistive sensor 106.

A write resistor 1004 is coupled to the write circuit 1016 (for writing to the disk), a heater resistor 1006 is coupled to the heater circuit 1018 (for controlling the fly height spacing), and a read resistor 1008 is coupled to the read circuit 1020 (for reading from the disk). The fly height sensor low, write circuit 1016, heater circuit 1018, and the read circuit 1020 are coupled to a silicon-on-chip (SoC) 1014 for processing. Embodiments of this disclosure provide the biasing circuit coupled to the amplifier of the fly height sensor low.

Figure 11:
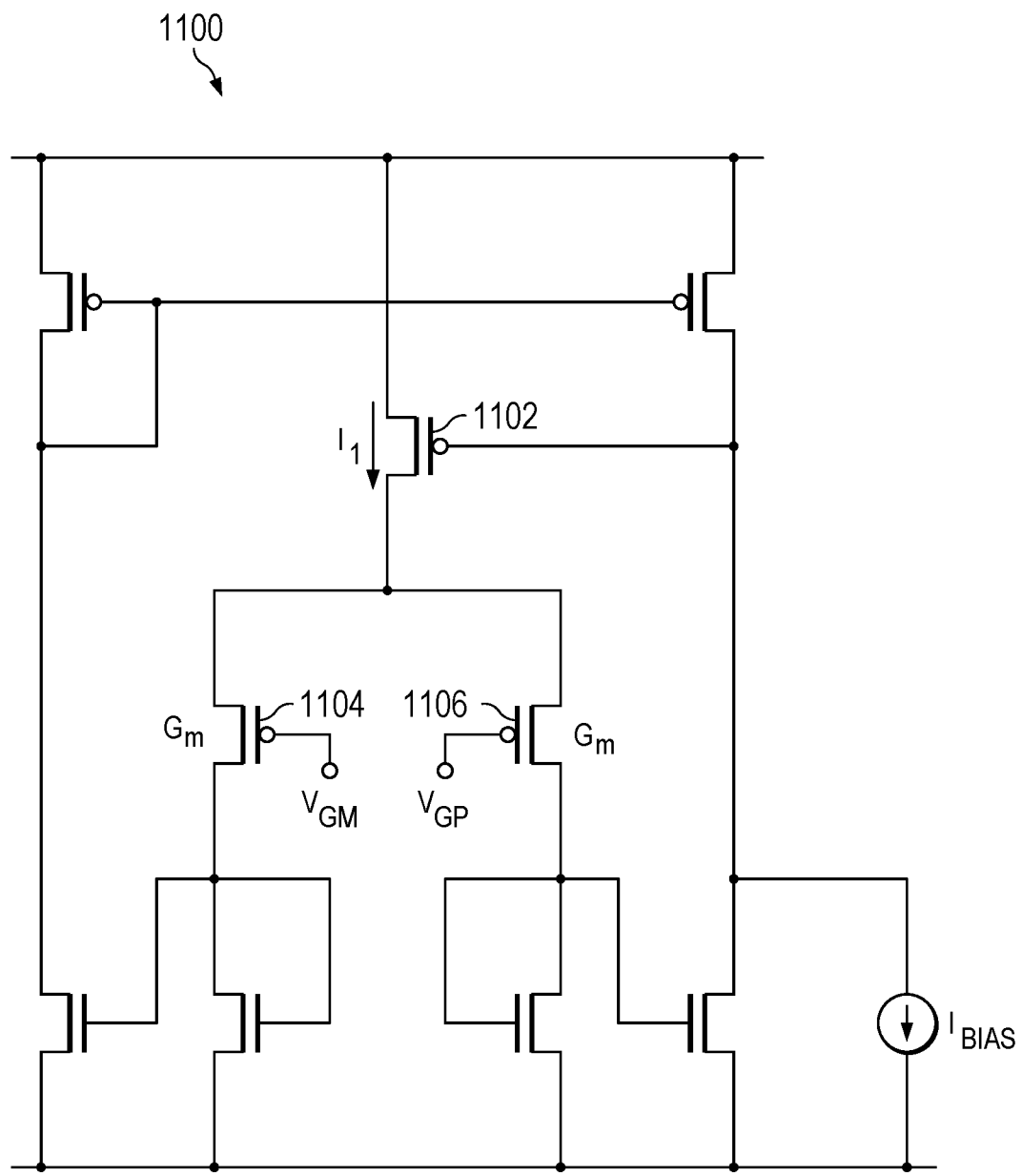
FIG. 11 is a block diagram of an embodiment gain recovery circuit.

FIG. 11 illustrates a block diagram of an embodiment gain recovery circuit 1100. Gain recovery circuit 1100 includes transistors 1102, 1104, 1106. The current ($I_1$) across the transistor 1102 is provided to the transistors 1104, 1106. The gain ($g_m$) of the transistors 1104, 1106 follows the equation (12):

$$g_m = \frac{I_{BIAS}}{V_{BIAS}} = \frac{1}{R_{SNS}},$$

where $V_{BIAS}$ is equal to the difference between the voltages at the control terminals of transistors 1104 and 1106 (i.e., $V_{GM}$-$V_{GP}$).

The gain ($g_m$) of the input pair of transistors 1104, 1106 is controlled by applying a differential voltage (i.e., bias voltage ($V_{BIAS}$)) and a current offset (i.e., bias current ($I_{BIAS}$)). The loop controls the current ($I_1$) to obtain the desired gain ($g_m$) of the input pair of transistors 1104, 1106. In embodiments, two copies of current ($I_1$) are provided to the gain recovery amplification circuit and two copies of current ($I_1$) are provided to the DC recovery stage in the voltage operating mode configuration.

Figure 12:
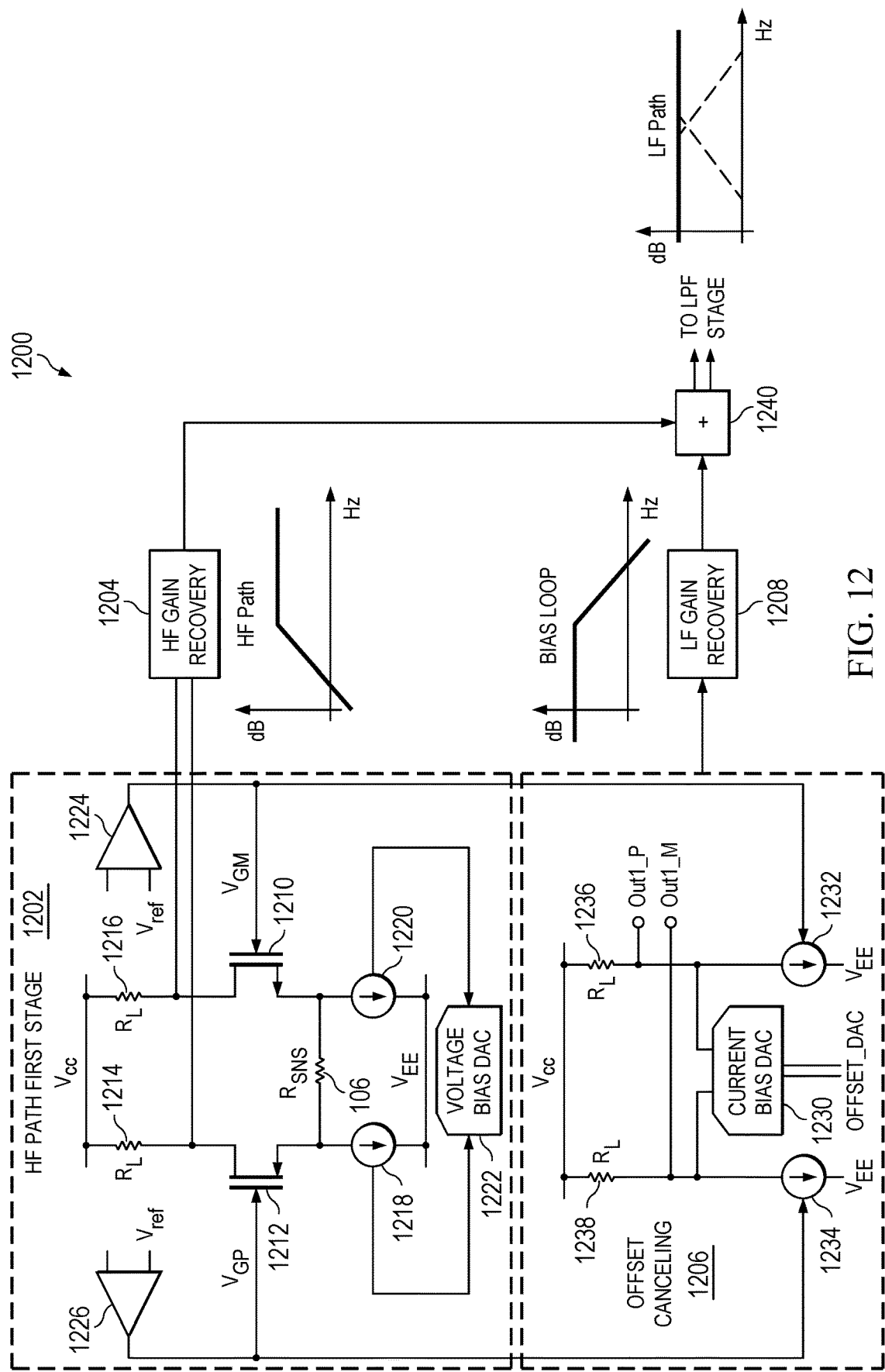
FIG. 12 is an embodiment circuit.

FIG. 12 illustrates an embodiment circuit 1200. Circuit 1200 is used to recover the low-frequency component of the sensing voltage ($V_{sig}$) when the resistive sensor 106 is biased by applying a constant voltage (i.e., voltage mode) across the terminals of the resistive sensor 106. Circuit 1200 includes a core circuit 1202, a high-frequency gain recovery stage circuit 1204, a low-frequency gain recovery stage circuit 1208, an offset canceling circuit 1206, and a summing circuit 1240, which may (or may not) be arranged as shown. Circuit 1200 may include additional components not shown.

As shown in FIG. 12, the core circuit 1202 is implemented as a low-impedance. However, it should be understood that the core circuit 1202 can also be implemented with a high impedance. For example, the circuit 500 is an implementation of a core circuit with a high-impedance—where the biasing circuit 502 is the high-impedance core and the gain recovery circuit 520 provides the low-frequency component recovery stage.

In embodiments, core circuit 1202 includes a pair of transistors 1210 and 1212 arranged as a differential pair. The source terminals of the transistors 1210, 1212 are coupled to the terminals of the resistive sensor 106, which are coupled to the source voltage ($V_{EE}$) through current sinks 1218, 1220. In embodiments, a first input of amplifiers 1224, 1226 control the operation of the current sinks 1218, 1220—a second input of the amplifiers 1224, 1226 are coupled to a reference voltage ($V_{REF}$). The drain terminals of the transistors 1210, 1212 are coupled to the source voltage ($V_{CC}$) through resistors ($R_L$) 1214, 1216. The control terminals of the transistors 1210, 1212 are coupled to voltage bias digital-to-analog converter 1222.

The voltage ($V_{in}$) across the terminals of the resistive sensor 106 are coupled to the input of the high-frequency gain recovery stage circuit 1204. The parameters of the high-frequency gain path follow the equation (9):

$$\text{Gain}_{HF} = \frac{R_L}{R_{SNS}} \times \frac{k \times R_{sns}}{R_x}, \text{ where } \text{Gain}_{HFGR} = \frac{k \times R_{sns}}{R_x}$$

is the gain of gain recovery stage circuit 1204, $R_L$ is the resistance of resistors 1214, 1216, $R_{SNS}$ is the resistance of the resistive sensor 106, $\text{Gain}_{HF}$ is the gain of the high-frequency path, $V_{in}$ is the input across the resistive sensor 106, $R_x$ is the resistance of the gain recovery block (i.e., used to create a current proportional to the input signal), and k is a constant parameter that can be chosen to achieve a desired gain of circuit 1204. Thus, the high-frequency gain recovery stage circuit 1204 amplifies the high-frequency component of the sensing signal ($V_{sig}$).

In embodiments, offset canceling circuit 1206 includes a current bias digital-to-analog converter 1230. The currents available in core circuit 1202 are mirrored in the offset canceling circuit 1206 for processing the low-frequency component of the sensing signal ($V_{sig}$). In embodiments, the first input of amplifiers 1224, 1226 control the operation of the current sinks 1232, 1234. The resistors 1236, 1238 couple the current sinks 1232, 1234 to the source voltage ($V_{EE}$).

The shared terminal between resistors 1236 and the current sink 1232 is coupled to a first input of the low-frequency gain recovery stage circuit 1208. The shared terminal between resistors 1238 and the current sink 1234 is coupled to a second input of the low-frequency gain recovery stage circuit 1208. The parameters of the low-frequency gain recovery stage circuit 1208 follow the equation (10):

$$\text{Gain}_{LF} = \left(\frac{1}{R_{SNS}}\right) \times R_L \times \frac{k \times R_{sns}}{R_x}, \text{ where } \text{Gain}_{LFGR} = \frac{k \times R_{sns}}{R_x}$$

is the gain of the low-frequency gain recovery stage circuit 1208, $R_L$ is the resistance of resistors 1236, 1238, $R_{SNS}$ is the resistance of the resistive sensor 106, $\text{Gain}_{LF}$ is the gain of the low-frequency path, $R_x$ is the resistance of the gain recovery block (i.e., used to create a current proportional to the input signal), and k is a constant parameter that can be chosen to achieve a desired gain of circuit 1208. Thus, the low-frequency gain recovery stage circuit 1208 amplifies the low-frequency component of the sensing signal ($V_{sig}$). The DC bias is removed from the current flowing in transistors 1210, 1212 using the current bias digital-to-analog converter 1230.

The output of the high-frequency gain recovery stage circuit 1204 and the low-frequency gain recovery stage circuit 1208 are summed using a summing circuit 1240. The output of the summing circuit 1240 is provided as a full signal bandwidth from the resistive sensor 106 as input to the low-pass frequency stage of the system.

In embodiments, the bias loop bandwidth is set to −3 dB pole for the high-frequency signal path (i.e., the output of core circuit 1202) and low-frequency signal path (i.e., the output of the offset canceling circuit 1206). In embodiments, the bandwidth of the high-frequency signal path is from the bias bandwidth to tens of megahertz. In embodiments, the bandwidth of the low-frequency signal path is from zero hertz to the bias bandwidth. The subtraction of a programmable offset by the current bias digital-to-analog converter 1230 provides a DC cancellation (i.e., removal of the DC bias value).

In embodiments, the gains (i.e., $\text{Gain}_{HF}$ and $\text{Gain}_{LF}$) from the high-frequency gain recovery stage circuit 1204 and the low-frequency gain recovery stage circuit 1208—before the summation by the summing circuit 1240, improves overall system noise performance. A matched gain with the same −3 dB pole in the high-frequency signal path and the low-frequency signal path reduced ripples on the full signal bandwidth output at the output of the summing circuit 1240.

Figure 13:
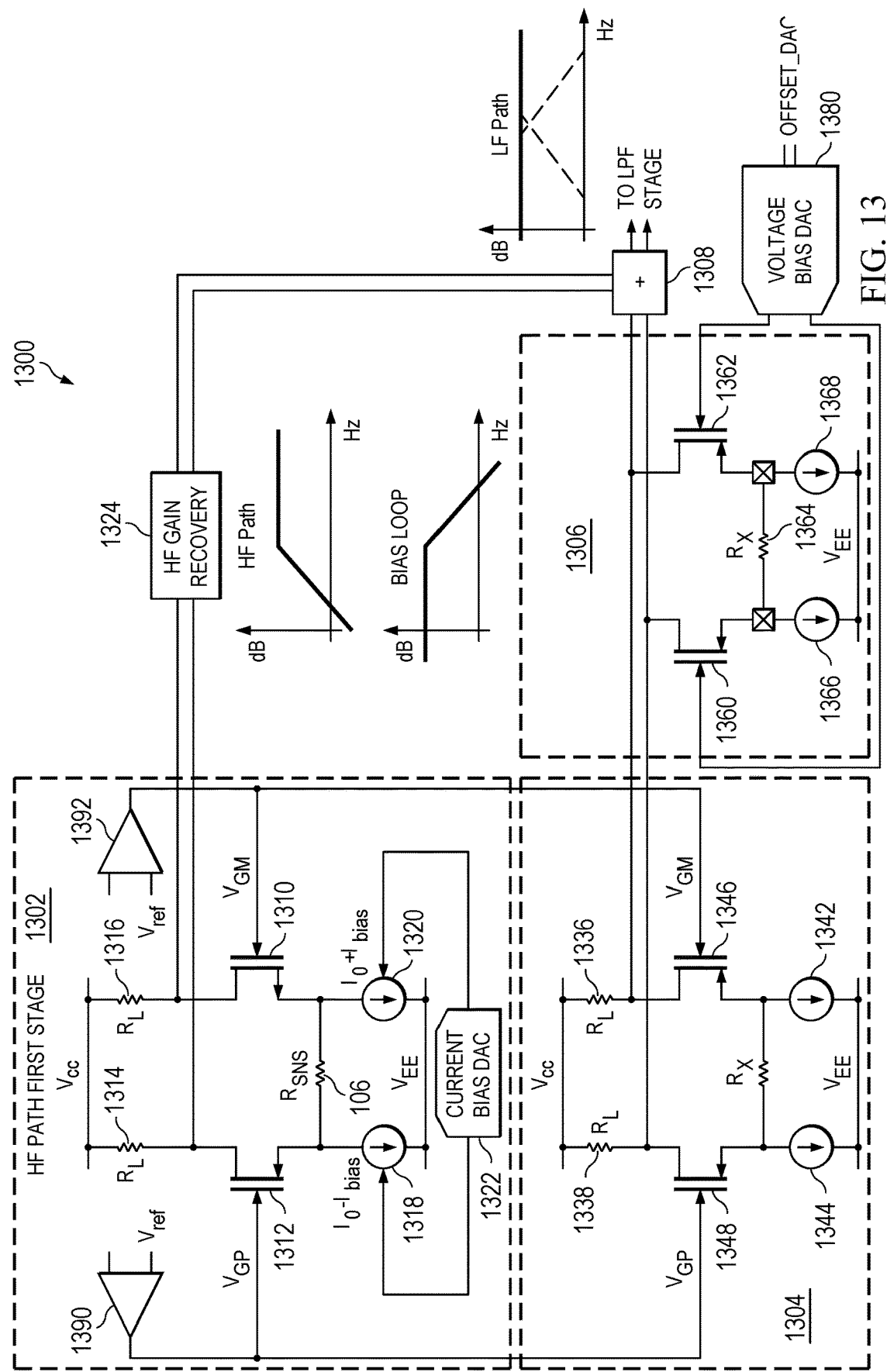
FIG. 13 is an embodiment circuit.

FIG. 13 illustrates an embodiment circuit 1300. Circuit 1300 is used to recover the low-frequency component of the sensing voltage ($V_{sig}$) when the resistive sensor 106 is biased by applying a constant current (i.e., current mode) across the terminals of the resistive sensor 106. Circuit 1300 includes a core circuit 1302, a differential difference amplifier (i.e., an amplifier circuit 1304, an offset canceling circuit 1306), a summing circuit 1308, and a voltage bias digital-to-analog converter 1380, which may (or may not) be arranged as shown. Circuit 1300 may include additional components not shown.

In embodiments, core circuit 1302 includes a pair of transistors 1310 and 1312 arranged as a differential pair. The source terminals of the transistors 1310, 1312 are coupled to the terminals of the resistive sensor 106, which are coupled to the source voltage ($V_{EE}$) through current sinks 1318, 1320. The drain terminals of the transistors 1310, 1312 are coupled to the source voltage ($V_{CC}$) through resistors ($R_L$) 1314, 1316.

In embodiments, a first input of amplifiers 1390, 1392 controls the control terminal of the transistors 1310, 1312. A second input of the amplifiers 1390, 1392 is coupled to a reference voltage ($V_{REF}$). The output of amplifiers 1390, 1392 also controls the control terminal of transistors 1348, 1346.

The voltage across the terminals of the resistive sensor 106 is coupled to the input of the high-frequency gain recovery stage circuit 1324. Thus, the high-frequency gain recovery stage circuit 1324 amplifies the high-frequency component of the sensing signal ($V_{sig}$), which is fed as a first input to the summing circuit 1308.

In embodiments, the first offset canceling circuit 1304 includes resistors ($R_L$) 1336, 1338, which are respectively coupled to the drain terminals of transistors 1346, 1348. A resistor ($R_X$) couples the source terminals of transistors 1346, 1348. The source terminal of transistors 1346, 1348 are coupled to the source voltage ($V_{EE}$) through current sinks 1342, 1344. In embodiments, transistors 1346, 1348 are mirrors of transistors 1312,1310 of the core circuit 1302. The voltages of the core circuit 1302 are, thus, mirrored at the first offset canceling circuit 1304 for processing the low-frequency component of the sensing signal ($V_{sig}$).

In embodiments, the second offset canceling circuit 1306 is coupled to the first offset canceling circuit 1304. Second offset canceling circuit 1306 includes transistors 1360, 1362. The source terminals of the transistors 1360, 1362 are coupled to each other through a resistor ($R_x$) 1364. The source terminal of the transistors 1360, 1362 are coupled to the source voltage ($V_{EE}$) through current sinks 1366, 1368. The control terminals of transistors 1360, 1362 are coupled to the output of the voltage bias digital-to-analog converter 1380. The drain terminal of transistor 1360 is coupled to the drain terminal of transistor 1348 of the first offset canceling circuit 1304. The drain terminal of transistor 1362 is coupled to the drain terminal of transistor 1346 of the first offset canceling circuit 1304. Thus, the first offset canceling circuit 1304 and second offset canceling circuit 1306 provide a low-frequency component of the sensing signal ($V_{sig}$) as a second input to the summing circuit 1308 to remove the DC component of the biased resistive sensor 106 and other offsets present in the circuit 1300.

The output of the core circuit 1302, the first offset canceling circuit 1304, and the second offset canceling circuit 1306 are summed using the summing circuit 1308. The output of the summing circuit 1308 is provided as a full signal bandwidth from the resistive sensor 106 as input to the low-pass frequency stage of the system.

Figure 14:
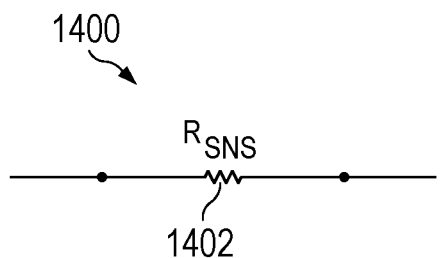
FIG. 14 is a block diagram of an embodiment circuit of a differential resistive sensor.

FIG. 14 illustrates a block diagram of an embodiment circuit 1400 of a differential resistive sensor 1402. In embodiments, the differential resistive sensor 1402 corresponds to the resistive sensor 106. In embodiments, the differential resistive sensor 1402 is an external component to the biasing circuit that provides a biasing voltage to the terminals of the differential resistive sensor 1402.

Embodiments of this disclosure provide a circuit and system that extracts and amplifies the full bandwidth (i.e., low-frequency component and high-frequency components) of the sensing signal ($V_{sig}$) from DC to biasing bandwidth (i.e., low-frequency) and from the biasing bandwidth to several megahertz (i.e., high-frequency component).

Figure 15:
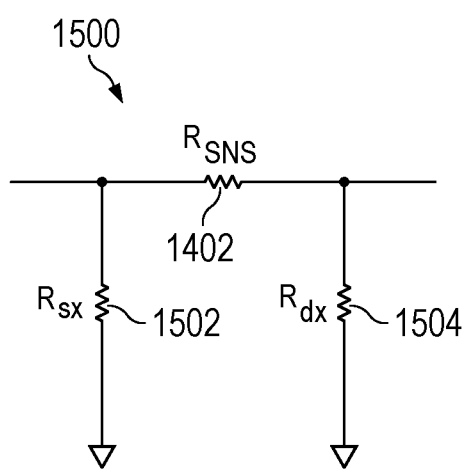
FIG. 15 is a block diagram of an embodiment circuit of single-ended resistive sensors.

FIG. 15 illustrates a block diagram of an embodiment circuit 1500 of the single-ended resistive sensor ($R_{sx}$) 1502 and the single-ended resistive sensor ($R_{dx}$) 1504. In embodiments, the single-ended resistive sensors 1502, 1504 correspond to the resistive sensor 106. In embodiments, the single-ended resistive sensors 1502, 1504 are external components to the biasing circuit that provide a biasing voltage to the first terminal of each single-ended resistive sensor 1502, 1504. A second terminal of each single-ended resistive sensor 1502, 1504 is coupled to a reference ground.

In embodiments, this disclosure provides a circuit and system that extracts and amplifies the high-frequency component (i.e., biasing bandwidth to several megahertz) of the sensing signal ($V_{sig}$) from single-ended resistive sensors 1502, 1504.

In embodiments, this disclosure provides a circuit and system that extracts and amplifies the full-bandwidth (i.e., low-frequency component and high-frequency components) of the sensing signal ($V_{sig}$) from DC to biasing bandwidth (i.e., low-frequency) and from the biasing bandwidth to several megahertz (i.e., high-frequency component) from single-ended resistive sensors 1502, 1504.

Figure 16A:
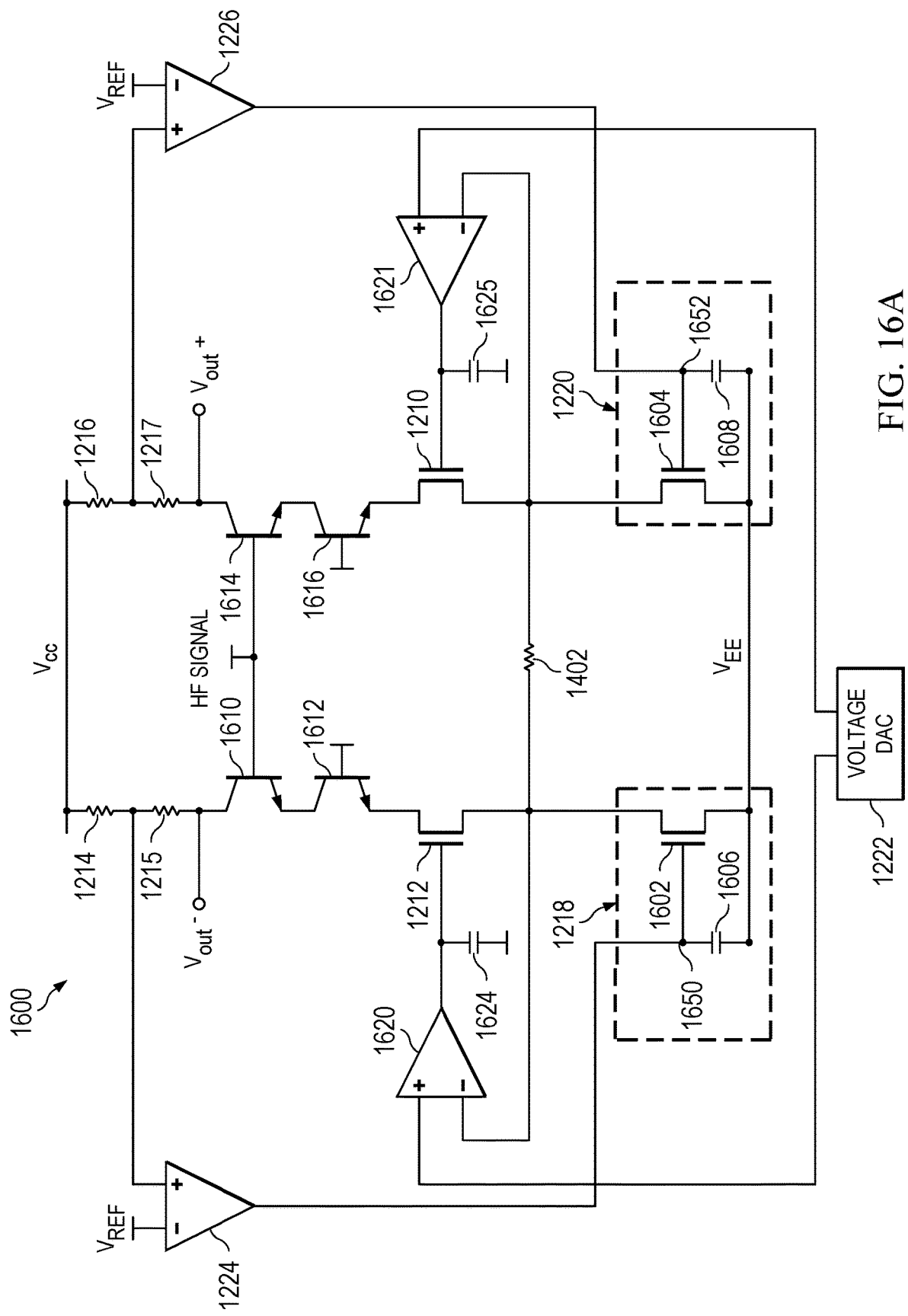
FIGS. 16A-B are block diagrams of embodiment circuits configured to operate in voltage mode.
Figure 16B:
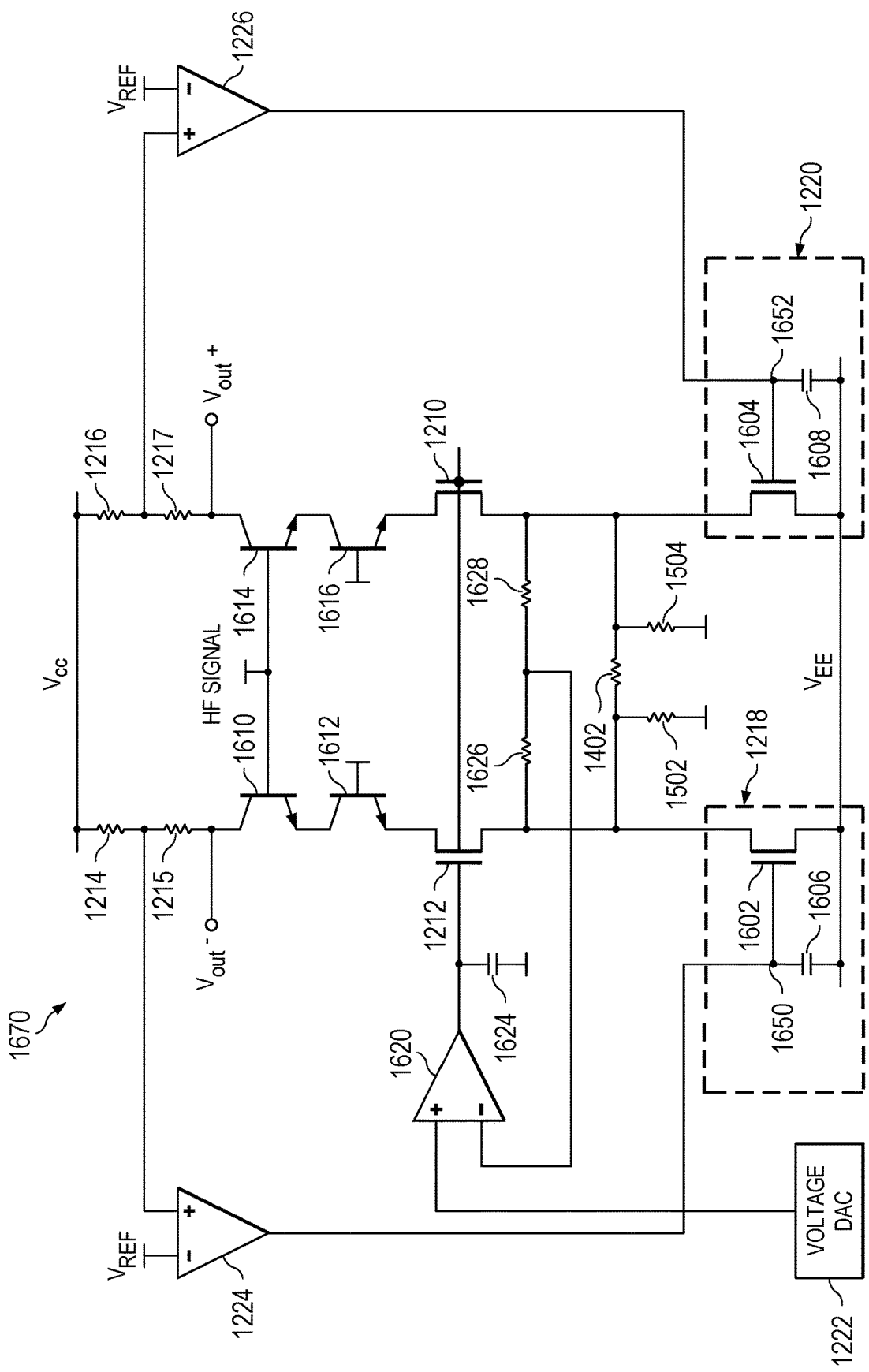

FIGS. 16A and 16B illustrate block diagrams of embodiment circuits 1600 and 1670 configured to operate in the voltage mode (i.e., setting a constant voltage). Circuits 1600 and 1670 correspond to implementing the core circuit 1202 of circuit 1200. Circuit 1600 operates on the differential resistive sensor ($R_{SNS}$) 1402. Circuit 1670 operates on single-ended resistive sensors ($R_{sx}$), ($R_{dx}$) 1502, 1504. For brevity, the shared components between circuits 1600 and 1670 are described only once with respect to circuit 1600.

Circuit 1600 includes the amplifiers 1224, 1226, resistors 1214, 1215, 1216, 1217 transistors 1210, 1212, current sinks 1218, 1220, NPN transistors 1610, 1612, 1614, 1616, and the voltage digital-to-analog converter 1222, which may (or may not) be arranged as shown. In embodiments, circuit 1600 includes additional components not shown. Details of circuit 1600 shared with the core circuit 1202 are not repeated for the sake of brevity.

Current sink 1218 is represented as a transistor 1602 coupled to the capacitor 1606. Current sink 1220 is represented as a transistor 1604 coupled to the capacitor 1608. Current sinks 1218, 1220 may be arranged in any manner known in the art.

The collector terminal of NPN transistor 1610 is coupled to a terminal of resistor 1215. The emitter terminal of NPN transistor 1610 is coupled to the collector terminal of NPN transistor 1612. The emitter terminal of NPN transistor 1612 is coupled to the drain terminal of transistor 1212. The collector terminal of NPN transistor 1614 is coupled to a terminal of resistor 1217. The emitter terminal of NPN transistor 1614 is coupled to the collector of NPN transistor 1616. The emitter terminal of NPN transistor 1616 is coupled to the drain terminal of transistor 1210. The base terminal of NPN transistor 1610 is coupled to the base terminal of NPN transistor 1614.

The shared terminal between the NPN transistor 1610 and resistor 1215 is the first signal ($V_{out-}$). The shared terminal between the NPN transistor 1614 and resistor 1217 is a second signal ($V_{out+}$). The first signal ($V_{out-}$) and the second signal ($V_{out+}$) are provided as the high-frequency component of the sensing signal ($V_{sig}$) to the high-frequency gain recovery stage circuit 1204 in circuit 1200.

In circuit 1600, the non-inverting inputs of amplifiers 1620, 1621 are coupled to the output of the voltage digital-to-analog converter 1222, with a bias voltage ($V_{bias}$). The inverting input of the amplifier 1620 is coupled to a first terminal of the differential resistive sensor 1402. The inverting input of the amplifier 1621 is coupled to a second terminal of the differential resistive sensor 1402. The output of the amplifiers 1620, 1621 are coupled to the control terminals of transistors 1212, 1210 and a first terminal of the shunt capacitors 1624, 1625. A second terminal of the shunt capacitors 1624, 1625 is coupled to the reference ground.

In embodiments, circuit 1600 includes the differential resistive sensor ($R_{SNS}$) 1402. In embodiments, circuit 1670 includes the single-ended resistive sensor ($R_{dx}$) 1504 and the single-ended resistive sensor ($R_{sx}$) 1502. In embodiments, circuits 1600 and 1670 can be unified in a unique circuit that includes the differential resistive sensor ($R_{SNS}$) 1402, the single-ended resistive sensor ($R_{dx}$) 1504, and the single-ended resistive sensor ($R_{sx}$) 1502.

In embodiments, circuit 1670 is a modification of circuit 1600. Circuit 1670 includes amplifier 1620, shunt capacitor 1624, resistor ($R_m$) 1626, and resistor ($R_p$) 1628, when circuit 1600 is used with single-ended resistive sensors ($R_{sx}$), ($R_{dx}$) 1502, 1504. In embodiments, resistors 1626, 1628 are biased with the same voltage. In embodiments, resistors 1626, 1628 generate the common mode voltage ($V_{INcm}$).

In this configuration, the non-inverting input of the amplifier 1620 is coupled to the output of the voltage digital-to-analog converter 1222, with a bias voltage ($V_{bias}$). The inverting input of amplifier 1620 is coupled to the shared terminal between resistors 1626, 1628. The other terminals of resistors 1626, 1628 are coupled to the source terminals of transistors 1212, 1210. The output of the amplifier 1620 is coupled to the control terminals of transistors 1210, 1212 and a first terminal of the shunt capacitor 1624. A second terminal of the shunt capacitor 1624 is coupled to the reference ground.

The voltage at the source terminal of the transistor 1212 is represented as the voltage ($V_{INm}$). The voltage at the source terminal of the transistor 1210 is represented as the voltage ($V_{INp}$). As transistors 1210, 1212 have a common control terminal, the voltage ($V_{INm}$) equals the voltage ($V_{INp}$). The common mode voltage ($V_{INcm}$) follows the equation (11):

$$V_{INcm} = \frac{V_{INp} + V_{INm}}{2}.$$

In embodiments, a signal loop path includes the amplifier 1620, transistors 1210, 1212, and resistors 1626, 1628. The signal loop path sets the common mode voltage ($V_{INcm}$) equal to the desired bias voltage ($V_{bias}$) using the voltage digital-to-analog converter 1222.

In embodiments, the voltages at nodes 1650, 1652 (i.e., at the control terminals of the transistors 1602, 1604), corresponding to the low-frequency component of the sensing signal ($V_{sig}$) of the resistive sensor(s), are extracted, amplified, and processed.

Figure 17A:
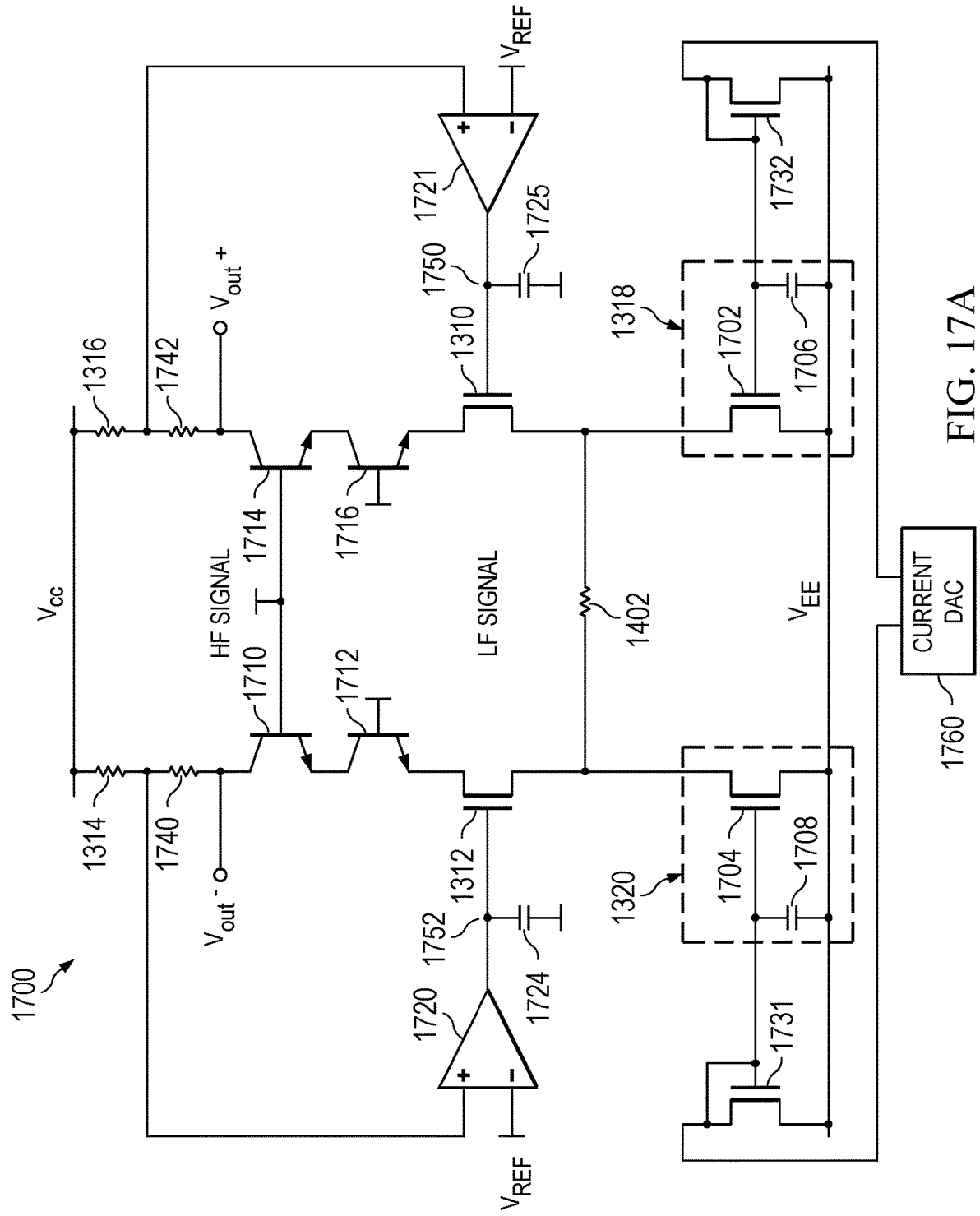
FIGS. 17A-B are block diagrams of embodiment circuits configured to operate in current mode.
Figure 17B:
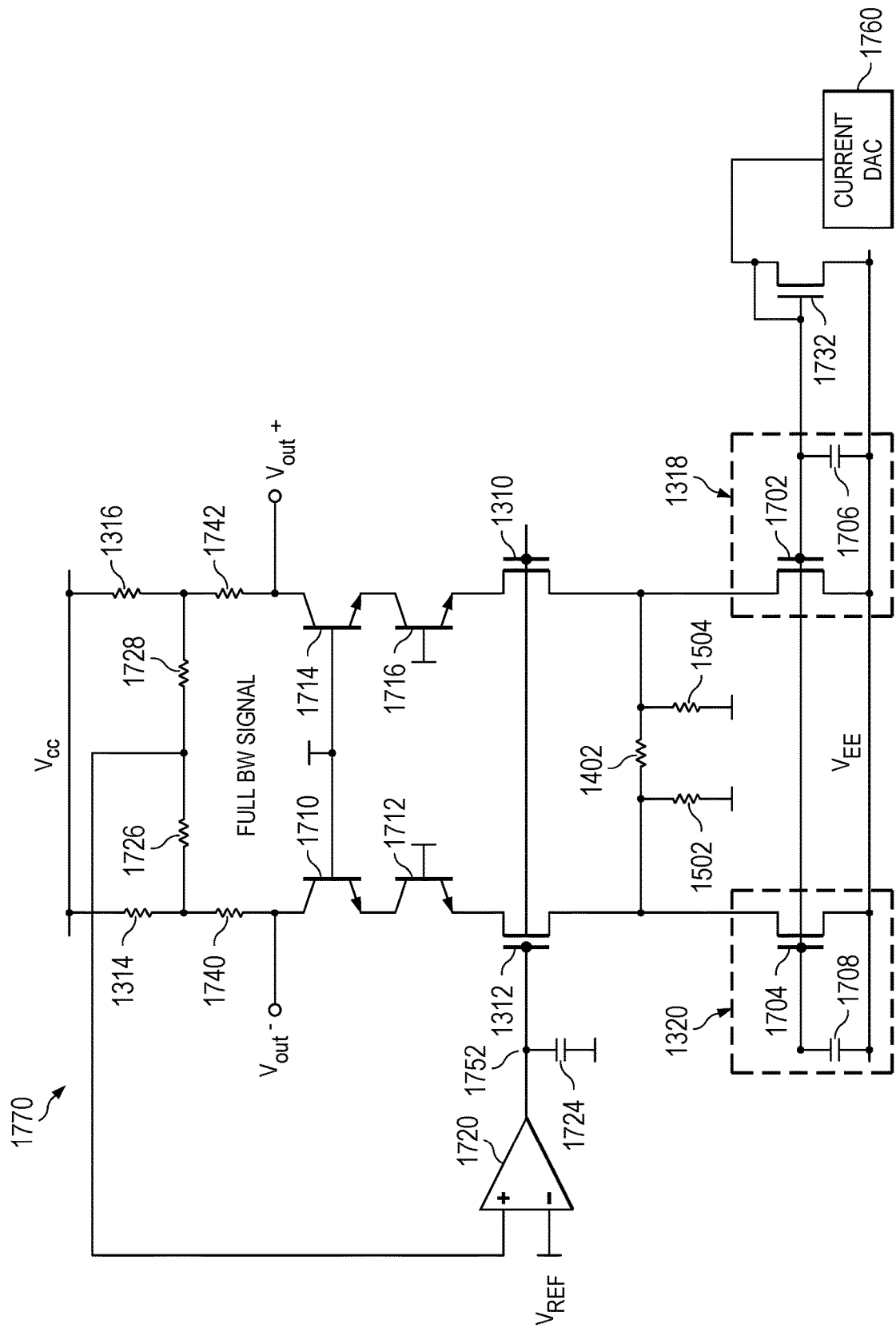

FIGS. 17A and 17B illustrate block diagrams of embodiment circuits 1700 and 1770 configured to operate in the current mode (i.e., setting a constant current). Circuits 1700 and 1770 correspond to an implementation of the core circuit 1302 of circuit 1300. Circuit 1700 operates on the differential resistive sensor ($R_{SNS}$) 1402. Circuit 1770 operates on single-ended resistive sensors ($R_{sx}$), ($R_{dx}$) 1502, 1504. For brevity, the shared components between circuits 1700 and 1770 are described only once with respect to circuit 1700.

Circuit 1700 includes resistors 1314, 1316, 1740, 1742 transistors 1310, 1312, 1731, 1732 current sinks 1318, 1320, NPN transistors 1710, 1712, 1714, 1716, and the current digital-to-analog converter 1760, which may (or may not) be arranged as shown. In embodiments, circuit 1700 includes additional components not shown. Details of circuit 1700 shared with the core circuit 1302 are not repeated for the sake of brevity.

In embodiments, the current digital-to-analog converter 1760 generates a current to the capacitor 1706, which is mirrored at the transistors 1702 and 1704. Current sink 1318 is represented as a transistor 1702 coupled to the capacitor 1706. Current sink 1320 is represented as a transistor 1704 coupled to the capacitor 1708. The output of the current digital-to-analog converter 1760 is coupled to the control terminals and drain terminals of transistors 1732, 1731, and the control terminals of transistors 1702, 1704 of the current sinks 1318, 1320. In embodiments, the same current is sunk by current sinks 1318, 1320. Current sinks 1318, 1320 may be arranged in any manner known in the art.

The collector terminal of NPN transistor 1710 is coupled to a terminal of resistor 1740. The emitter terminal of NPN transistor 1710 is coupled to the collector terminal of NPN transistor 1712. The emitter terminal of NPN transistor 1712 is coupled to the drain terminal of transistor 1312. The collector terminal of NPN transistor 1714 is coupled to a terminal of resistor 1742. The emitter terminal of NPN transistor 1714 is coupled to the collector of NPN transistor 1716. The emitter terminal of NPN transistor 1716 is coupled to the drain terminal of transistor 1310. The base terminal of NPN transistor 1710 is coupled to the base terminal of NPN transistor 1714.

The shared terminal between the NPN transistor 1710 and resistor 1740 is a first signal ($V_{out-}$). The shared terminal between the NPN transistor 1714 and resistor 1742 is a second signal ($V_{out+}$). The first signal ($V_{out-}$) and the second signal ($V_{out+}$) are provided as the high-frequency component of the sensing signal ($V_{sig}$) to the high-frequency gain recovery stage circuit 1324 in circuit 1300.

In an embodiment (circuit 1700), the non-inverting input of the amplifier 1720 is coupled to the shared terminal between resistors 1314, 1740. The non-inverting input of the amplifier 1721 is coupled to the shared terminal between resistors 1316 and 1742. The inverting inputs of the amplifiers 1720, 1721 are coupled to a reference voltage. The output of the amplifiers 1720, 1721 are coupled to the control terminals of transistors 1310, 1312 and a first terminal of the shunt capacitors 1724, 1725. A second terminal of the shunt capacitors 1724, 1725 is coupled to the reference ground. The expected current flows through differential resistive sensors 1402 for biasing the resistor with constant current.

In embodiments, circuit 1700 includes the differential resistive sensor ($R_{SNS}$) 1402. In embodiments, circuit 1770 includes the single-ended resistive sensor ($R_{dx}$) 1504 and the single-ended resistive sensor ($R_{sx}$) 1502. In embodiments, circuits 1700 and 1770 can be unified in a unique circuit that includes the differential resistive sensor ($R_{SNS}$) 1402, the single-ended resistive sensor ($R_{dx}$) 1504, and the single-ended resistive sensor ($R_{sx}$) 1502.

In embodiments, circuit 1770, a modified version of circuit 1700, one of the amplifiers 1720 or 1721 can be removed and the output of the amplifier can be used as a common terminal for both transistors 1312 and 1310, while resistor ($R_A$) 1726 and resistor ($R_B$) 1728 are added. In embodiments, resistors 1726, 1728 are biased with the same voltage. In embodiments, resistors 1726, 1728 generate the common mode voltage ($V_C$).

In this embodiment, the non-inverting input of the amplifier 1720 is coupled to the shared terminal between resistors 1726, 1728. The other terminals of resistors 1726, 1728 are coupled to the shared terminals of resistors 1314, 1740 and shared terminals of resistors 1316, 1742. The inverting input of the amplifier 1720 is coupled to a reference voltage. The output of the amplifier 1720 is coupled to the control terminals of transistors 1310, 1312 and a first terminal of the shunt capacitor 1724. A second terminal of the shunt capacitor 1724 is coupled to the reference ground. The same current flows through the single-ended resistive sensors ($R_{sx}$), ($R_{dx}$) 1502, 1504 for biasing the resistors the single-ended resistive sensors ($R_{sx}$), ($R_{dx}$) 1502, 1504.

The voltage at the shared terminal between resistors 1314, 1726, and 1740 is represented as the voltage ($V_A$). The voltage at the shared terminal between resistors 1316, 1728, 1742 is represented as the voltage ($V_B$). The common mode voltage ($V_C$) follows the equation (12):

$$V_C = \frac{V_A + V_B}{2}.$$

In embodiments, a signal loop path includes the amplifier 1720, transistors 1310, 1312, and resistors 1314, 1316. The signal loop path sets the common mode voltage ($V_C$) equal to the desired reference voltage ($V_{ref}$). A controlled common-mode current is set on transistors 1310, 1312.

In embodiments, the voltages at nodes 1750, 1752 (i.e., at the control terminals of the transistors 1310, 1312), corresponding to the low-frequency component of the sensing signal ($V_{sig}$) of the resistive sensor(s), are extracted, amplified, and processed.

Figure 18:
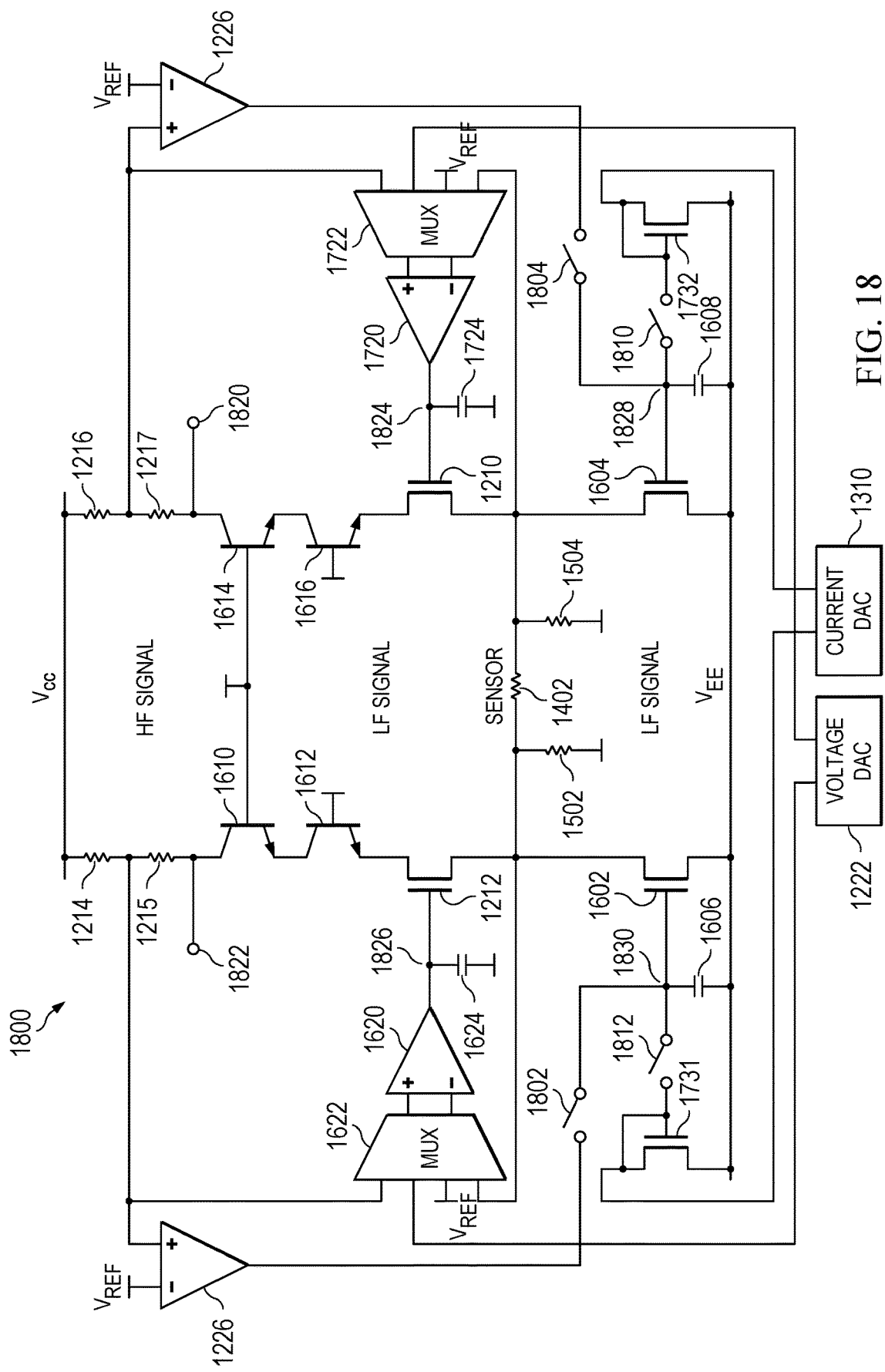
FIG. 18 is a block diagram of an embodiment circuit.

FIG. 18 illustrates a block diagram of an embodiment circuit 1800. Circuit 1800 can operate in either the voltage mode or the current mode. Circuit 1800 includes multiple switches, selectively enabled (i.e., close position) or disabled (i.e., open position) to operate circuit 1800 in either the voltage or current mode of operation. In embodiments, circuit 1800 includes circuit 1600 and circuit 1700, and switches 1802, 1804, 1810, and 1812.

In embodiments, circuit 1800 operates as circuit 1600 when switches 1802, 1804, are in the closed position and switches 1810, 1812 are in the open position. In embodiments, circuit 1800 operates as circuit 1700 when the switches 1810, 1812 are in the closed position and switches 1802, 1804 are in the open position.

In embodiments, circuits 1600 and 1700 can be implemented on the same silicon as illustrated with circuit 1800—as circuits 1600 and 1700 share several common components. Further, circuits 1600 and 1700, and further implementation of these circuits in a single circuit 1800 allows a single circuit 1800 to be configured to operate in any combination of (i) voltage or current mode or (ii) with a differential resistive sensor (e.g., differential resistive sensor 1402) or the single-ended resistors (e.g., single-ended resistors 1502, 1504).

In embodiments, when circuit 1800 is operating in current or voltage mode, the voltages at nodes 1820, 1822, corresponding to the high-frequency component of the sensing signal ($V_{sig}$) of the resistive sensor(s), are extracted, amplified, and processed.

In embodiments, when circuit 1800 is operating in current mode (i.e., a constant current source at the resistive sensor), the voltages at nodes 1824, 1826, corresponding to the low-frequency component of the sensing signal ($V_{sig}$) of the resistive sensor(s), are extracted, amplified, and processed.

In embodiments, when circuit 1800 is operating in the voltage mode (i.e., a constant voltage source at the resistive sensor), the voltages at nodes 1828 and 1830, corresponding to the low-frequency component of the sensing signal ($V_{sig}$) of the resistive sensor(s) are extracted, amplified, and processed.

In embodiments, circuit 1800 includes multiplexers 1622 and 1722, which can be used to switch between the various configurations, as outlined with respect to circuits 1600, 1670, 1700, and 1770.

Figure 19:
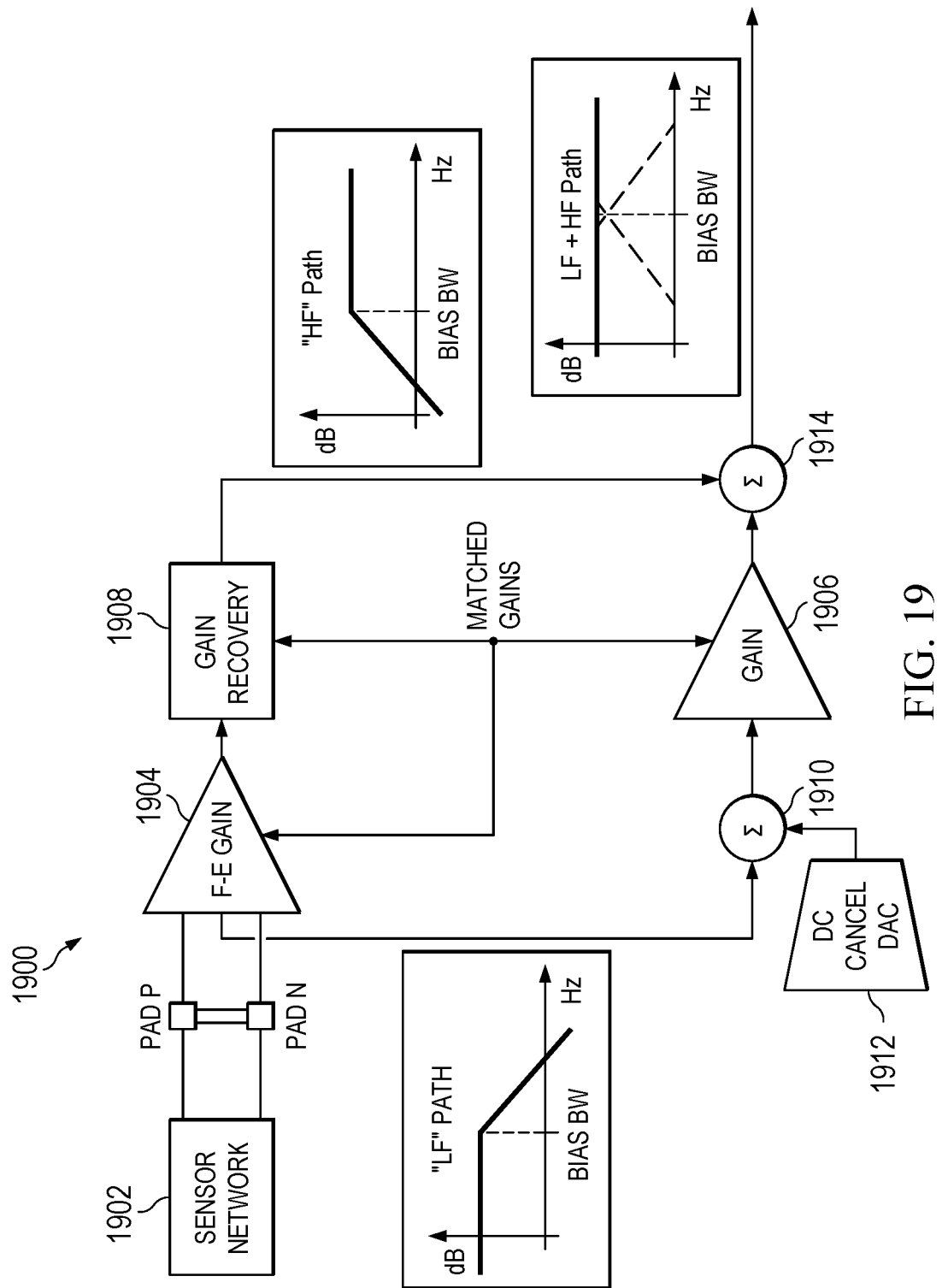
FIG. 19 is a simplified block diagram of an embodiment system.

FIG. 19 illustrates a simplified block diagram of an embodiment system 1900. System 1900 includes the sensor network circuit 1902, resistive sensor 106, amplifiers 1904, 1906, gain recovery circuit 1908, summing circuit 1910, DC canceling digital-to-analog converter circuit 1912, and summing circuit 1914, which may (or may not) be arranged as shown. System 1900 may include additional components, such as a controller or a memory, not shown.

Sensor network circuit 1902 is coupled to the terminals of the resistive sensor 106 at node (Pad P) and node (Pad N). The resistive sensor 106 is coupled to (i) a high-frequency path that includes the amplifier 1904 and the gain recovery circuit 1908 and (ii) a low-frequency path that includes the summing circuit 1910, DC canceling digital-to-analog converter circuit 1912, and the amplifier 1906.

In embodiments, the gain of the amplifier 1906 is matched with the gain of the amplifier 1904 and gain recovery circuit 1908 (with the same −3 dB poles in the low-frequency and high-frequency paths) to minimize ripples on the full signal bandwidth path. In other words, the gain of the amplifier 1906 equals the sum gain of amplifiers 1904 and 1908. The amplifiers 1904 and 1906 are used to amplify the signal in each of the respective high-frequency and low-frequency paths to improve the noise performance of the system.

The high-frequency path provides a high-pass transfer function to extract and amplify the high-frequency component (i.e., from bias bandwidth to tens of megahertz). The low-frequency path provides a low-pass transfer function to extract and amplify the low-frequency component (i.e., from DC to bias bandwidth). The DC canceling digital-to-analog converter circuit 1912 is summed with the low-frequency signal at the summing circuit 1910 to subtract a programmable offset to remove the DC bias value (i.e., DC bias cancelation).

Summing circuit 1914 is used to sum the high-frequency component of the sensing signal ($V_{sig}$) across the resistive sensor 106 and the low-frequency component of the sensing signal ($V_{sig}$). In embodiments, the output of the summing circuit 1914 provides an amplified full bandwidth signal of the sensing signal ($V_{sig}$) to be processed and analyzed to determine and monitor, for example, the fly height of a hard disk drive.

FIG. 20 illustrates the low-frequency path signal 2002 from the low-frequency path as an input to the summing circuit 1914, the high-frequency path signal 2004 from the high-frequency path as an input to the summing circuit 1914, and the full-bandwidth signal 2006 at the output of the summing circuit 1914. As shown, the gains of the low-frequency path signal 2002 and the high-frequency path signal 2004 are matched with the gain of the full-bandwidth signal 2006.

In embodiments, each operating mode (e.g., current or voltage mode) is supported and bit selectable (e.g., by end-user). Some embodiments may be used for consumer, automotive, or industrial applications using thermistors or piezo resistors. Some embodiments can perform both bias (i.e., constant voltage and constant current) and amplification in a single stage with low impact on noise and area, giving different bandwidth outputs in different frequency ranges (i.e., from DC to tens of MHz) simultaneously and in both bias modes. The advantages of some embodiments include common mode bias for low-impedance single-ended resistors in current and voltage modes (with current capability). AC-coupled differential signal elaboration is made available in both bias modes. DC-coupled differential signal elaboration is made available in the current mode, with a flat bandwidth. DC and AC coupled signal chain outputs are available at the same time or independently in the current bias mode.

The advantages of some embodiments include common mode bias of single-ended low-impedance resistors in both current and voltage bias modes. Differential signal from single-ended loads is likewise achieved. AC, DC, or both AC and DC coupling of the signal are also available depending on bias mode and user requests.

A first aspect relates to a circuit, which includes a core and a low-frequency recovery circuit. The core circuit is configured to bias a resistive sensor used to measure a fly height of a hard disk drive. The core circuit is additionally configured to amplify a high-frequency component of a sensing signal of the resistive sensor, which indicates the fly height. The low-frequency recovery circuit is configured to amplify a low-frequency component of the sensing signal.

In a first implementation form of the circuit, according to the first aspect as such, the resistive sensor is a single differential resistive sensor.

In a second implementation form of the circuit, according to the first aspect as such or any preceding implementation form of the first aspect, the resistive sensor includes a pair of single-ended resistive sensors.

In a third implementation form of the circuit, according to the first aspect as such or any preceding implementation form of the first aspect, the circuit further includes a summing circuit configured to sum the high-frequency component of the sensing signal with the low-frequency component of the sensing signal.

In a fourth implementation form of the circuit, according to the first aspect as such or any preceding implementation form of the first aspect, the low-frequency component of the sensing signal corresponds to a frequency range from DC to a bias bandwidth of the resistive sensor. And, the high-frequency component of the sensing signal corresponds to a frequency range greater than the bias bandwidth.

In a fifth implementation form of the circuit, according to the first aspect as such or any preceding implementation form of the first aspect, the core circuit is configured to bias the resistive sensor in a voltage mode configuration corresponding to providing a constant voltage to terminals of the resistive sensor.

In a sixth implementation form of the circuit, according to the first aspect as such or any preceding implementation form of the first aspect, the core circuit is configured to bias the resistive sensor in a current mode configuration corresponding to providing a constant current across terminals of the resistive sensor.

A second aspect relates to a circuit, including a core and low-frequency recovery circuits. The core circuit includes a pair of amplifiers, a voltage-biasing digital-to-analog converter, a first pair of transistors having control terminals coupled to the voltage-biasing digital-to-analog converter, a second pair of transistors having control terminals coupled to a respective one of the pair of amplifiers, a resistive sensor coupled to the pair of transistors, and a first pair of resistors coupled to the pair of transistors. The low-frequency recovery circuit includes a current offset digital-to-analog converter, a third pair of transistors having control terminals coupled to a respective one of the pair of amplifiers, and a second pair of resistors coupled to the current offset digital-to-analog converter and the third pair of transistors.

In a first implementation form of the circuit, according to the second aspect as such, the core circuit is configured to bias the resistive sensor used to measure a fly height of a hard disk drive.

In a second implementation form of the circuit, according to the second aspect as such or any preceding implementation form of the second aspect, the circuit further includes a gain recovery circuit configured to compensate a gain dependence of the circuit over variations in temperature and a resistive value of the resistive sensor. The high-frequency component of the sensing signal corresponds to a frequency range greater than the bias bandwidth of the resistive sensor.

In a third implementation form of the circuit, according to the second aspect as such or any preceding implementation form of the second aspect, the low-frequency gain recovery circuit further includes a gain recovery circuit configured to amplify a low-frequency component of a sensing signal of the resistive sensor. The sensing signal indicates a fly height of a hard disk drive, and the low-frequency component of the sensing signal corresponds to a frequency range from DC to a bias bandwidth of the resistive sensor.

In a fourth implementation form of the circuit, according to the second aspect as such or any preceding implementation form of the second aspect, the circuit further includes a gain recovery circuit configured to amplify the low-frequency component.

In a fifth implementation form of the circuit, according to the second aspect as such or any preceding implementation form of the second aspect, the circuit further includes a summing circuit configured to sum a high-frequency component of a sensing signal with a low-frequency component of the sensing signal. The sensing signal indicates a fly height of a hard disk drive.

In a sixth implementation form of the circuit, according to the second aspect as such or any preceding implementation form of the second aspect, the voltage biasing digital-to-analog converter is configured to bias the resistive sensor in a voltage mode configuration corresponding to providing a constant voltage to terminals of the resistive sensor. The current offset digital-to-analog converter is configured to cancel a DC component of a sensing signal of the resistive sensor. The sensing signal indicates a fly height of a hard disk drive.

A third aspect relates to a circuit, including a core circuit, a first low-frequency recovery circuit, and a second low-frequency recovery circuit. The core circuit includes a pair of amplifiers, a current biasing digital-to-analog converter, a first pair of transistors having control terminals coupled to the current biasing digital-to-analog converter, a second pair of transistors having control terminals coupled to a respective one of the pair of amplifiers, the second pair of transistors set such that a current flowing through each is constant and equal to an expected current, a resistive sensor coupled to the first pair of transistors and biased in accordance with the expected current, and a first pair of resistors coupled to the second pair of transistors. The first low-frequency recovery circuit includes a first common resistor, a third pair of transistors, wherein a first set of terminals of the third pair of transistors is coupled to terminals of the first common resistor, and wherein a control terminal of each of the third pair of transistors is coupled to a respective one of the pair of amplifiers and a respective control terminal of an associated transistor of the second pair of transistors, and a second pair of resistors coupled to the third pair of transistors. The second low-frequency circuit includes a second common resistor, a fourth pair of transistors, wherein a first set of terminals is coupled to terminals of the second common resistor, and a second set of terminals of the fourth pair of transistors is coupled to the second pair of resistors, and a voltage offset digital-to-analog converter coupled to control terminals of the fourth pair of transistors.

In a first implementation form of the circuit, according to the third aspect as such, the core circuit is configured to bias the resistive sensor used to measure a fly height of a hard disk drive. The core circuit further includes a gain recovery circuit configured to amplify a high-frequency component of a sensing signal of the resistive sensor. The high-frequency component of the sensing signal corresponds to a frequency range greater than a bias bandwidth of the resistive sensor.

In a second implementation form of the circuit, according to the third aspect as such or any preceding implementation form of the third aspect, the first low-frequency recovery circuit further includes a gain recovery circuit configured to amplify a low-frequency component of the sensing signal. The sensing signal indicates a fly height of a disk drive. The low-frequency component of the sensing signal corresponds to a frequency range from DC to a bias bandwidth of the resistive sensor.

In a third implementation form of the circuit, according to the third aspect as such or any preceding implementation form of the third aspect, the second low-frequency recovery circuit is configured to cancel a DC component of the sensing signal.

In a fourth implementation form of the circuit, according to the third aspect as such or any preceding implementation form of the third aspect, the circuit further includes a summing circuit configured to sum a high-frequency component of a sensing signal from the core circuit with a low-frequency component of the sensing signal from the first low-frequency recovery circuit. The sensing signal indicates a fly height of a hard disk drive.

In a fifth implementation form of the circuit, according to the third aspect as such or any preceding implementation form of the third aspect, the current biasing digital-to-analog converter is configured to bias the resistive sensor in a current mode configuration corresponding to providing a constant current across the terminals of the resistive sensor.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit comprising:
   a core circuit configured to:
      bias a resistive sensor, the resistive sensor configured to measure a fly height of a hard disk drive, and
      amplify a high-frequency component of a sensing signal of the resistive sensor, the sensing signal indicating the fly height; and
   a low-frequency recovery circuit configured to amplify a low-frequency component of the sensing signal.

2. The circuit of claim 1, wherein the resistive sensor is a single differential resistive sensor.

3. The circuit of claim 1, wherein the resistive sensor comprises a pair of single-ended resistive sensors.

4. The circuit of claim 1, further comprising a summing circuit configured to sum the high-frequency component of the sensing signal with the low-frequency component of the sensing signal.

5. The circuit of claim 1, wherein the low-frequency component of the sensing signal corresponds to a frequency range from DC to a bias bandwidth of the resistive sensor, and wherein the high-frequency component of the sensing signal corresponds to a frequency range greater than the bias bandwidth.

6. The circuit of claim 1, wherein the core circuit is configured to bias the resistive sensor in a voltage mode configuration corresponding to providing a constant voltage to terminals of the resistive sensor.

7. The circuit of claim 1, wherein the core circuit is configured to bias the resistive sensor in a current mode configuration corresponding to providing a constant current across terminals of the resistive sensor.

8. A circuit comprising:
   a core circuit comprising:
      a pair of amplifiers,
      a voltage-biasing digital-to-analog converter,
      a first pair of transistors having control terminals coupled to the voltage-biasing digital-to-analog converter,
      a second pair of transistors having control terminals coupled to a respective one of the pair of amplifiers,
      a resistive sensor coupled to the second pair of transistors, and
      a first pair of resistors coupled to the second pair of transistors; and
   a low-frequency recovery circuit comprising:
      a current offset digital-to-analog converter,
      a third pair of transistors having control terminals coupled to a respective one of the pair of amplifiers, and
      a second pair of resistors coupled to the current offset digital-to-analog converter and the third pair of transistors.

9. The circuit of claim 8, wherein the core circuit is configured to bias the resistive sensor, the resistive sensor configured to measure a fly height of a hard disk drive.

10. The circuit of claim 9, further comprising a gain recovery circuit configured to compensate a gain dependence of the circuit over variations in temperature and a resistive value of the resistive sensor, the core circuit configured to amplify a high-frequency component of a sensing signal, the sensing signal indicating a fly height of a hard disk drive, the high-frequency component of the sensing signal corresponding to a frequency range greater than a bias bandwidth of the resistive sensor.

11. The circuit of claim 8, wherein the low-frequency recovery circuit further comprises a gain recovery circuit configured to amplify a low-frequency component of a sensing signal of the resistive sensor, the sensing signal indicating a fly height of a hard disk drive, and the low-frequency component of the sensing signal corresponding to a frequency range from DC to a bias bandwidth of the resistive sensor.

12. The circuit of claim 11, further comprising a gain recovery circuit configured to amplify the low-frequency component.

13. The circuit of claim 8, further comprising a summing circuit configured to sum a high-frequency component of a sensing signal with a low-frequency component of the sensing signal, the sensing signal indicating a fly height of a hard disk drive.

14. The circuit of claim 8, wherein the voltage-biasing digital-to-analog converter is configured to bias the resistive sensor in a voltage mode configuration corresponding to providing a constant voltage to terminals of the resistive sensor, and wherein the current offset digital-to-analog converter is configured to cancel a DC component of a sensing signal of the resistive sensor, the sensing signal indicating a fly height of a hard disk drive.

15. A circuit comprising:
  a core circuit comprising:
    a pair of amplifiers,
    a current biasing digital-to-analog converter,
    a first pair of transistors having control terminals coupled to the current biasing digital-to-analog converter,
    a second pair of transistors having control terminals coupled to a respective one of the pair of amplifiers, the second pair of transistors set such that a current flowing through each is constant and equal to an expected current,
    a resistive sensor coupled to the first pair of transistors and biased in accordance with the expected current, and
    a first pair of resistors coupled to the second pair of transistors;
  a first low-frequency recovery circuit comprising:
    a first common resistor,
    a third pair of transistors, wherein a first set of terminals of the third pair of transistors is coupled to terminals of the first common resistor, and wherein a control terminal of each of the third pair of transistors is coupled to a respective one of the pair of amplifiers and a respective control terminal of an associated transistor of the second pair of transistors, and
    a second pair of resistors coupled to the third pair of transistors; and
  a second low-frequency recovery circuit comprising:
    a second common resistor,
    a fourth pair of transistors, wherein a first set of terminals is coupled to terminals of the second common resistor, and a second set of terminals of the fourth pair of transistors is coupled to the second pair of resistors, and
    a voltage offset digital-to-analog converter coupled to control terminals of the fourth pair of transistors.

16. The circuit of claim 15, wherein the core circuit is configured to bias the resistive sensor, the resistive sensor configured to measure a fly height of a hard disk drive, and wherein the core circuit further comprises a gain recovery circuit configured to amplify a high-frequency component of a sensing signal of the resistive sensor, the high-frequency component of the sensing signal corresponding to a frequency range greater than a bias bandwidth of the resistive sensor.

17. The circuit of claim 15, wherein the first low-frequency recovery circuit further comprises a gain recovery circuit configured to amplify a low-frequency component of a sensing signal, the sensing signal indicating a fly height of a disk drive, and the low-frequency component of the sensing signal corresponding to a frequency range from DC to a bias bandwidth of the resistive sensor.

18. The circuit of claim 15, wherein the second low-frequency recovery circuit is configured to cancel a DC component of a sensing signal, the sensing signal indicating a fly height of a disk drive.

19. The circuit of claim 15, further comprising a summing circuit configured to sum a high-frequency component of a sensing signal from the core circuit with a low-frequency component of the sensing signal from the first low-frequency recovery circuit, the sensing signal indicating a fly height of a hard disk drive.

20. The circuit of claim 15, wherein the current biasing digital-to-analog converter is configured to bias the resistive sensor in a current mode configuration corresponding to providing a constant current across the terminals of the resistive sensor.

* * * * *